(12) United States Patent
Chiang et al.

(10) Patent No.: US 10,475,828 B2
(45) Date of Patent: Nov. 12, 2019

(54) IMAGE SENSOR DEVICE STRUCTURE WITH DOPING LAYER IN LIGHT-SENSING REGION

(71) Applicant: Taiwan Semiconductor Manufacturing Co., Ltd., Hsinchu (TW)

(72) Inventors: Yen-Ting Chiang, Tainan (TW); Chun-Yuan Chen, Tainan (TW); Hsiao-Hui Tseng, Tainan (TW); Yu-Jen Wang, Kaohsiung (TW); Shyh-Fann Ting, Tainan (TW); Wei-Chuang Wu, Tainan (TW); Jen-Cheng Liu, Hsinchu (TW); Dun-Nian Yaung, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/868,324

(22) Filed: Jan. 11, 2018

(65) Prior Publication Data

US 2019/0157319 A1 May 23, 2019

Related U.S. Application Data

(60) Provisional application No. 62/589,007, filed on Nov. 21, 2017.

(51) Int. Cl.
*H01L 27/146* (2006.01)
*H01L 31/0352* (2006.01)
*H01L 31/11* (2006.01)

(52) U.S. Cl.
CPC ...... *H01L 27/1461* (2013.01); *H01L 27/1463* (2013.01); *H01L 27/1464* (2013.01);
(Continued)

(58) Field of Classification Search
CPC ........... H01L 27/1463; H01L 27/14638; H01L 27/1464; H01L 27/14685; H01L 31/11; H01L 31/03529
(Continued)

(56) References Cited

U.S. PATENT DOCUMENTS 8,101,454 B2 * 1/2012 Baggenstoss ..... H01L 27/14601
257/437
9,406,713 B2 8/2016 Fan et al.
(Continued)

FOREIGN PATENT DOCUMENTS

| TW | 201714289 A | 4/2017 |
| TW | 201717379 A | 5/2017 |
| TW | I591834 B | 7/2017 |

OTHER PUBLICATIONS

Office Action dated May 8, 2019 in Taiwan application No. 107122076, pp. 1-5.

*Primary Examiner* — Dao H Nguyen
(74) *Attorney, Agent, or Firm* — McClure, Qualey & Rodack, LLP

(57) ABSTRACT

An image sensor device structure is provided. The image sensor device structure includes a substrate, and the substrate is doped with a first conductivity type. The image sensor device structure includes a light-sensing region formed in the substrate, and the light-sensing region is doped with a second conductivity type that is different from the first conductivity type. The image sensor device structure further includes a doping region extended into the light-sensing region, and the doping region is doped with the first conductivity type. The image sensor device structure also includes a plurality of color filters formed on the doping region.

20 Claims, 23 Drawing Sheets

(52) U.S. Cl.
CPC .. *H01L 27/14638* (2013.01); *H01L 27/14685* (2013.01); *H01L 31/03529* (2013.01); *H01L 31/11* (2013.01); *H01L 27/14612* (2013.01); *H01L 27/14621* (2013.01); *H01L 27/14629* (2013.01)

(58) Field of Classification Search
USPC .......... 257/292, 432, 437, E21.214, E31.12, 257/E31.001; 438/70, 71, 72
See application file for complete search history.

(56) References Cited

U.S. PATENT DOCUMENTS

| | | | |
|---|---|---|---|
| 2008/0211047 A1* | 9/2008 | Iida | H01L 27/14603 257/432 |
| 2009/0020842 A1 | 1/2009 | Shiau et al. | |
| 2009/0325337 A1* | 12/2009 | Cheng | H01L 27/1461 438/70 |
| 2013/0234202 A1* | 9/2013 | JangJian | H01L 27/1464 257/184 |
| 2017/0141153 A1 | 5/2017 | Lee et al. | |
| 2017/0186799 A1* | 6/2017 | Lin | H01L 21/78 |
| 2018/0040651 A1* | 2/2018 | Lee | H01L 27/1461 |

\* cited by examiner

IMAGE SENSOR DEVICE STRUCTURE WITH DOPING LAYER IN LIGHT-SENSING REGION

CROSS REFERENCE TO RELATED APPLICATIONS

This Application claims the benefit of U.S. Provisional Application No. 62/589,007 filed on Nov. 21, 2017, and entitled "Image sensor device structure with doping layer in light-sensing region", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

An image sensor is used to convert an optical image focused on the image sensor into an electrical signal. The image sensor includes an array of light-detecting elements, such as photodiodes, and a light-detecting element is configured to produce an electrical signal corresponding to the intensity of light impinging on the light-detecting element. The electrical signal is used to display a corresponding image on a monitor or provide information about the optical image.

Although existing image sensor device structures and methods for forming the same have been generally adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3E' shows a cross-sectional representation of a modified image sensor device structure, in accordance with some embodiments of the disclosure.

FIG. 5F' shows a cross-sectional representation of a modified image sensor device structure, in accordance with some embodiments of the disclosure.

DETAILED DESCRIPTION

Figure 1A:
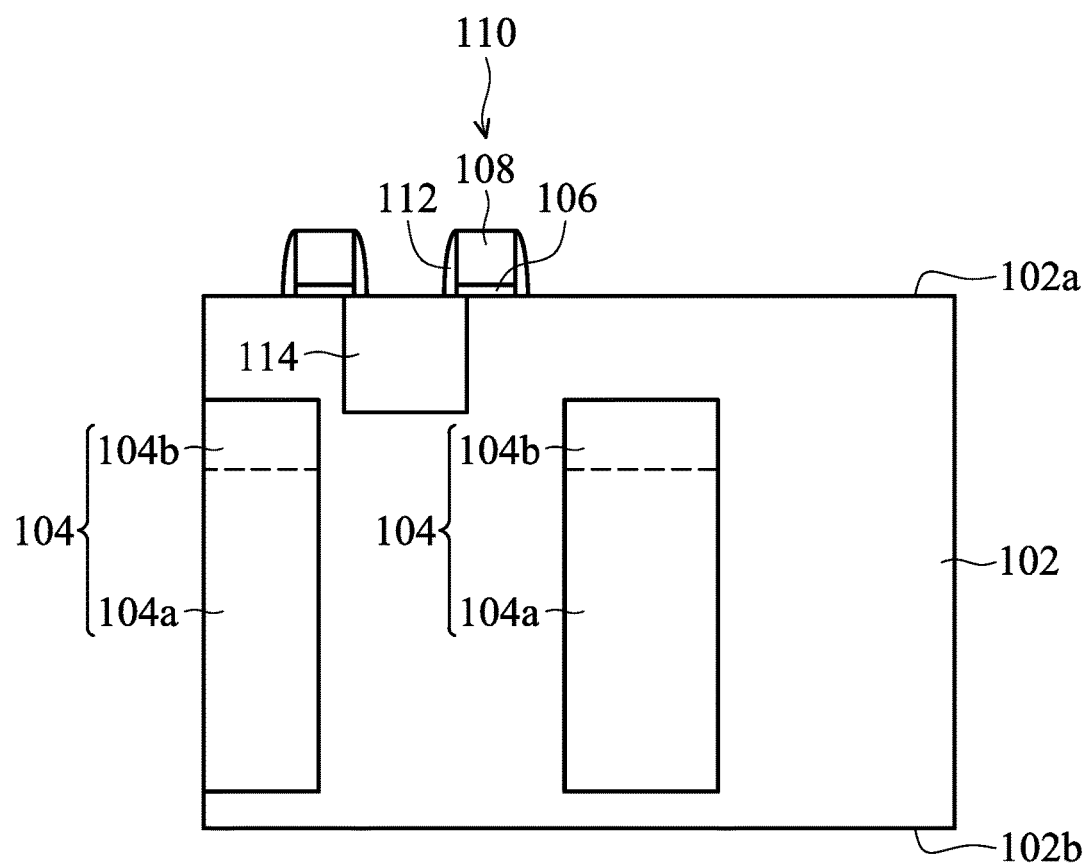
FIGS. 1A-1F show cross-sectional representations of various stages of forming an image sensor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for an image sensor device structure and method for forming the same are provided. FIGS. 1A-1F show cross-sectional representations of various stages of forming an image sensor device structure 100, in accordance with some embodiments of the disclosure. The image sensor device structure 100 is applied to a backside illuminated (BSI) image sensor device structure.

Referring to FIG. 1A, a substrate 102 is provided. The substrate 102 has a first surface 102a and a second surface 102b. The substrate 102 may be made of silicon or other semiconductor materials. In some embodiments, the substrate 102 is a wafer. Alternatively or additionally, the substrate 102 may include other elementary semiconductor materials such as germanium. In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A light-sensing region 104 is formed in the substrate 102. The light-sensing region 104 is used to detect the intensity (brightness) of red, green and blue light wavelengths, respectively. In some embodiments, the light-sensing region 104 is a photodiode (PD) region. The light-sensing region 104 may be doped with dopants. In some embodiments, the substrate 102 is doped with a first conductivity type, and the light-sensing region 104 is doped with a second conductivity type. In some embodiments, the substrate 102 is doped with p-type dopants, such as boron (B) or gallium (Ga), and the light-sensing region 104 is doped with n-type dopants, such as phosphorus (P) or arsenic (As).

The light-sensing region 104 may include a first portion 104a with a first doping concentration and a second portion 104b with a second doping concentration. The second portion 104b is closer to a transistor device structure 110 than the first portion 104a. The second doping concentration of the second portion 104b is greater than the first doping concentration of the first portion 104a. The second doping concentration is greater than the first doping concentration is used to facilitate the transfer of the photoelectron. In some embodiments, the first doping concentration of the first portion 104a is in a range from about 1E15 to about 1E17. In some embodiments, the second doping concentration of the second portion 104b is in a range from about 1E16 to about 1E19.

The transistor device structure 110 is formed over the first surface 102a of the substrate 102. The transistor device structure 110 includes a gate dielectric layer 106 and a gate electrode layer 108 over the gate dielectric layer 106. A pair of gate spacers 112 are formed on sidewall surfaces of the transistor device structure 110. In some embodiments, the transistor device structure 110 is a transfer transistor device structure.

The gate dielectric layer 106 is made of dielectric materials, such as silicon oxide, silicon nitride, silicon oxynitride, dielectric material with high dielectric constant (high-k), or a combination thereof. The gate dielectric layer 106 is formed by a deposition process, such as chemical vapor deposition (CVD), physical vapor deposition (PVD), atomic layer deposition (ALD), high density plasma CVD (HDP-CVD), metal organic CVD (MOCVD), or plasma enhanced CVD (PECVD). The gate electrode layer 108 may be made of conductive material, such as aluminum (Al), copper (Cu), tungsten (W), titanium (Ti), tantalum (Ta), or another applicable material. The first gate electrode layer 108 may be formed by a deposition process, such as chemical vapor deposition (CVD), physical vapor deposition (PVD), atomic layer deposition (ALD), or another applicable process.

In some embodiments, the gate spacers 112 are made of silicon oxide, silicon nitride, silicon oxynitride or other applicable material. In some embodiments, the gate spacers 112 are formed by a chemical vapor deposition (CVD) process or a physical vapor deposition (PVD) process.

A doping region 114 is formed below the transistor device structure 110. The transistor device structure 110 is between the light-sensing region 104 and the doping region 114. In some embodiments, the doping region 114 is a floating node (FD) region. The doping region 114 is formed by performing an ion implant process using the transistor device structure 110 as a mask. In some embodiments, the doping region 114 is doped with n-type dopants.

The substrate 102 may further include isolation features (not shown), such as shallow trench isolation (STI) features or local oxidation of silicon (LOCOS) features. Isolation features may define and isolate various device elements.

In some embodiments, four n-type MOS transistors are formed. The four n-type MOS transistors are a transfer transistor Tx for transferring optical charges collected at the photodiode to a floating diffusion (FD) region, a reset transistor Rx for setting an electrical potential of the floating diffusion (FD) region in a preferred level and resetting the floating diffusion (FD) region after discharging charges, a drive transistor Dx for functioning as a source follower buffer amplifier, and a select transistor Sx for performing a switching function to address the pixel.

Other device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements may be formed over the substrate 102. Various processes are performed to form device elements, such as deposition, etching, implantation, photolithography, annealing, and/or other applicable processes. In some embodiments, device elements are formed in the substrate 102 in a front-end-of-line (FEOL) process.

Figure 1B:
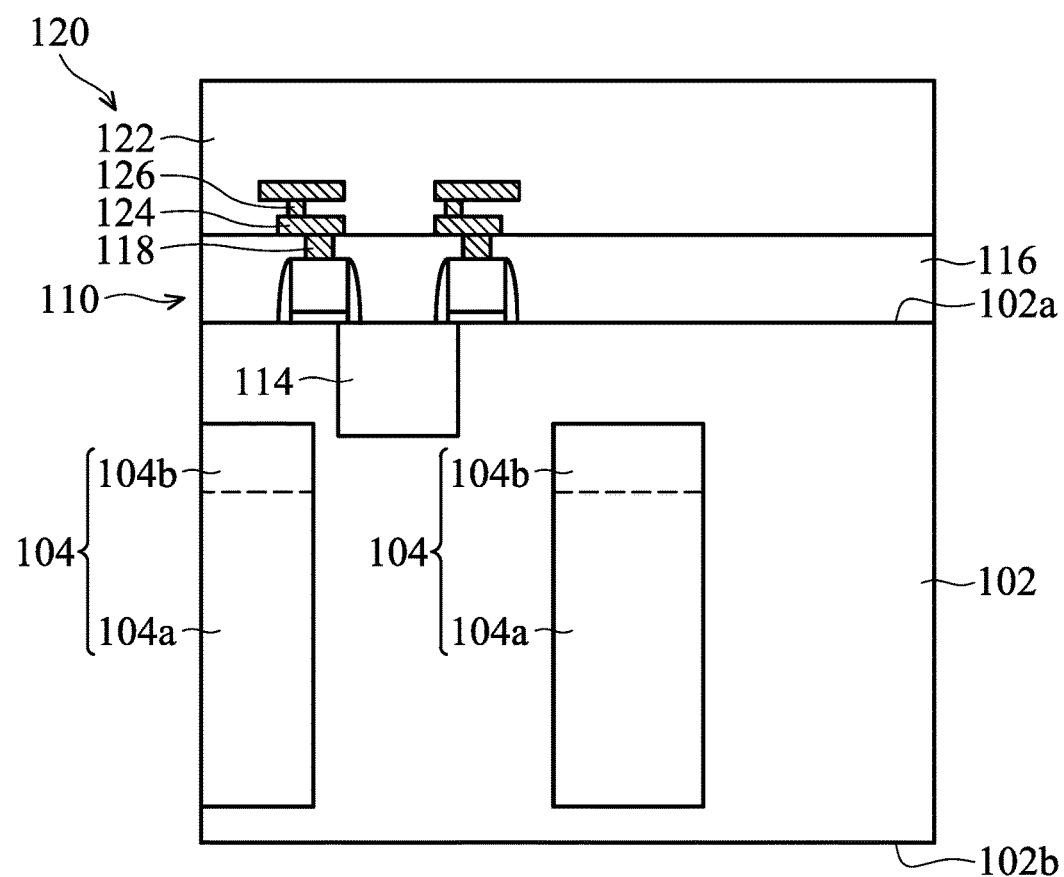

Afterwards, as shown in FIG. 1B, an inter-layer dielectric (ILD) layer 116 is formed over the first surface 102a of the substrate 102, in accordance with some embodiments of the disclosure. The ILD layer 116 may include multilayers. The ILD layer 116 is made of silicon oxide (SiOx), silicon nitride (SixNy), silicon oxynitride (SiON) or low-k dielectric material, another applicable dielectric material.

A contact structure 118 is formed in the ILD layer 116 and over the transistor device structure 110. The contact structure 118 is made of conductive material, such as such as copper (Cu), copper alloy, aluminum (Al), aluminum alloy, tungsten (W), tungsten alloy, titanium (Ti), titanium alloy, tantalum (Ta), tantalum alloy, or another applicable material.

An interconnect structure 120 is formed over the ILD layer 116. The interconnect structure 120 includes an inter-metal dielectric (IMD) layer 122, a conductive line 124 and a conductive via plug 126. The IMD layer 122 may be a single layer or multiple layers. The conductive line 124 and the conductive via plug 126 are formed in the IMD layer 122. The conductive line 124 is electrically connected to another adjacent conductive line 124 through the conductive via plug 126. The interconnect structure 120 is formed in a back-end-of-line (BEOL) process.

The IMD layer 122 is made of silicon oxide (SiOx), silicon nitride (SixNy), silicon oxynitride (SiON), dielectric material(s) with low dielectric constant (low-k), or combinations thereof. In some embodiments, the IMD layer 122 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the IMD layer 122 is deposited by a plasma enhanced chemical vapor deposition (PECVD) process or by a spin coating process.

The conductive line 124 and the conductive via plug 126 and are independently made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive line 124 and the conductive via plug 126 are formed by a plating method.

Figure 1C:
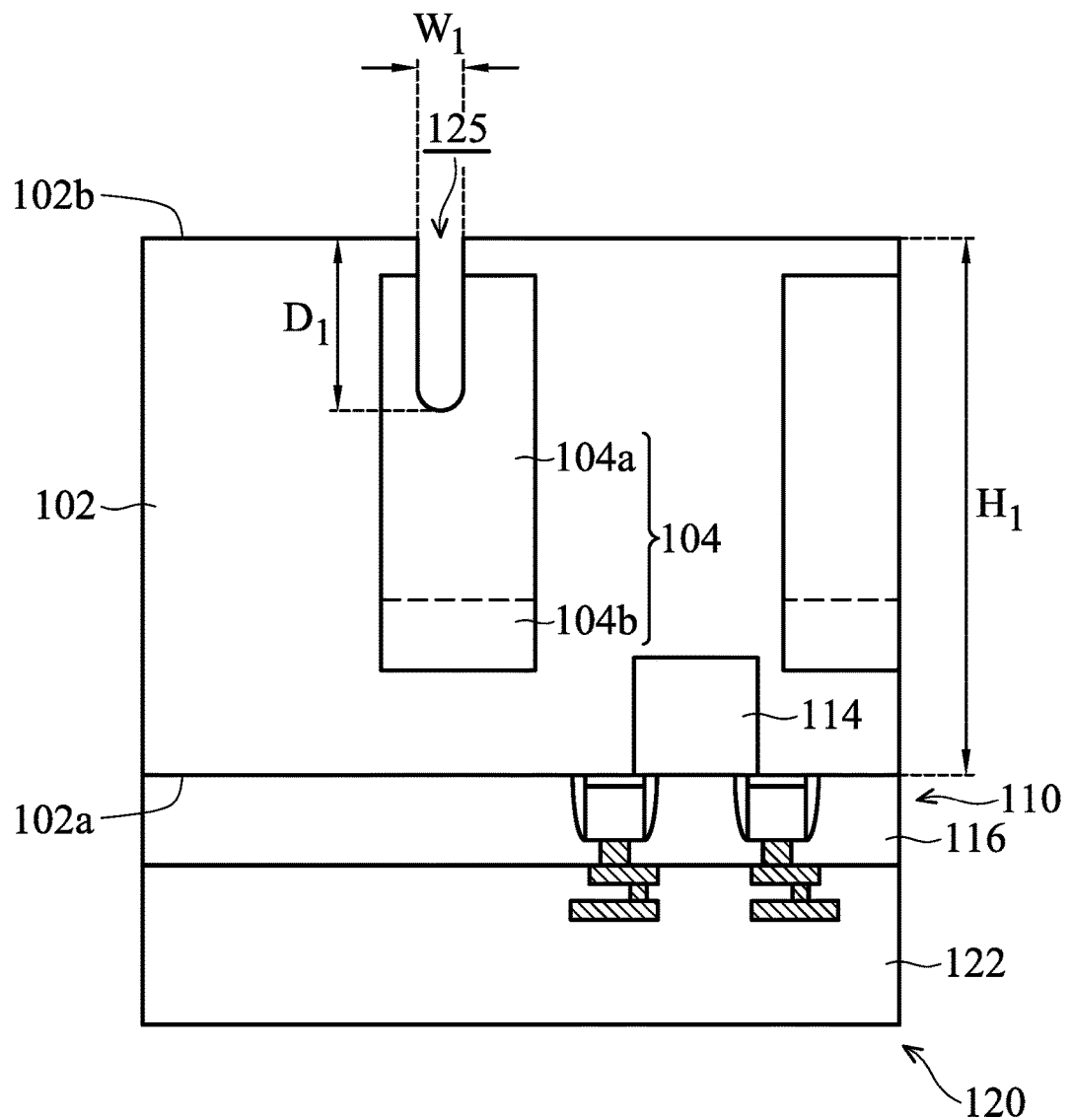

Afterwards, as shown in FIG. 1C, the substrate 102 is reversed and the bottom surface 102b of the substrate 102 faces up, in accordance with some embodiments of the disclosure. Next, a trench 125 is formed in the light-sensing region 104. The trench 125 is formed by removing a portion of the light-sensing region 104 in the substrate 102.

The trench 125 is formed by a patterned process. The patterning process includes a photolithography process and an etching process. The photolithography process includes photoresist coating (e.g., spin-on coating), soft baking, mask aligning, exposure, post-exposure baking, developing the photoresist, rinsing, and drying (e.g., hard baking). The etching process includes a dry etching process or a wet etching process.

The trench 125 has a first width $W_1$ which is measured along a horizontal direction, and the horizontal direction is parallel to the second surface 102b of the substrate 102. The trench 125 has a first depth $D_1$ which is measured from the second surface 102b of the substrate 102. The substrate 102 has a first height $H_1$ which is a distance between the first surface 102a and the second surface 102b along a vertical direction. In some embodiments, the first width $W_1$ is in a range from about 0.1 µm to about 0.4 µm. In some embodiments, the first depth $D_1$ is in a range from about 0.5 µm to about 3 µm. In some embodiments, the first height $H_1$ is in a range from about 2 µm to about 6 µm. If the first depth $D_1$ of the trench 125 is too small, the contacting area of the light-sensing region 104 with the doping region 134 (as shown in FIG. 1E) may be not enough. If the first depth $D_1$ of the trench 125 is too high, the area of the light-sensing region 104 is occupied by the doping region 134 (as shown in FIG. 1E), and the area of the light-sensing region 104 is too small to store the photoelectrons.

Figure 1D:
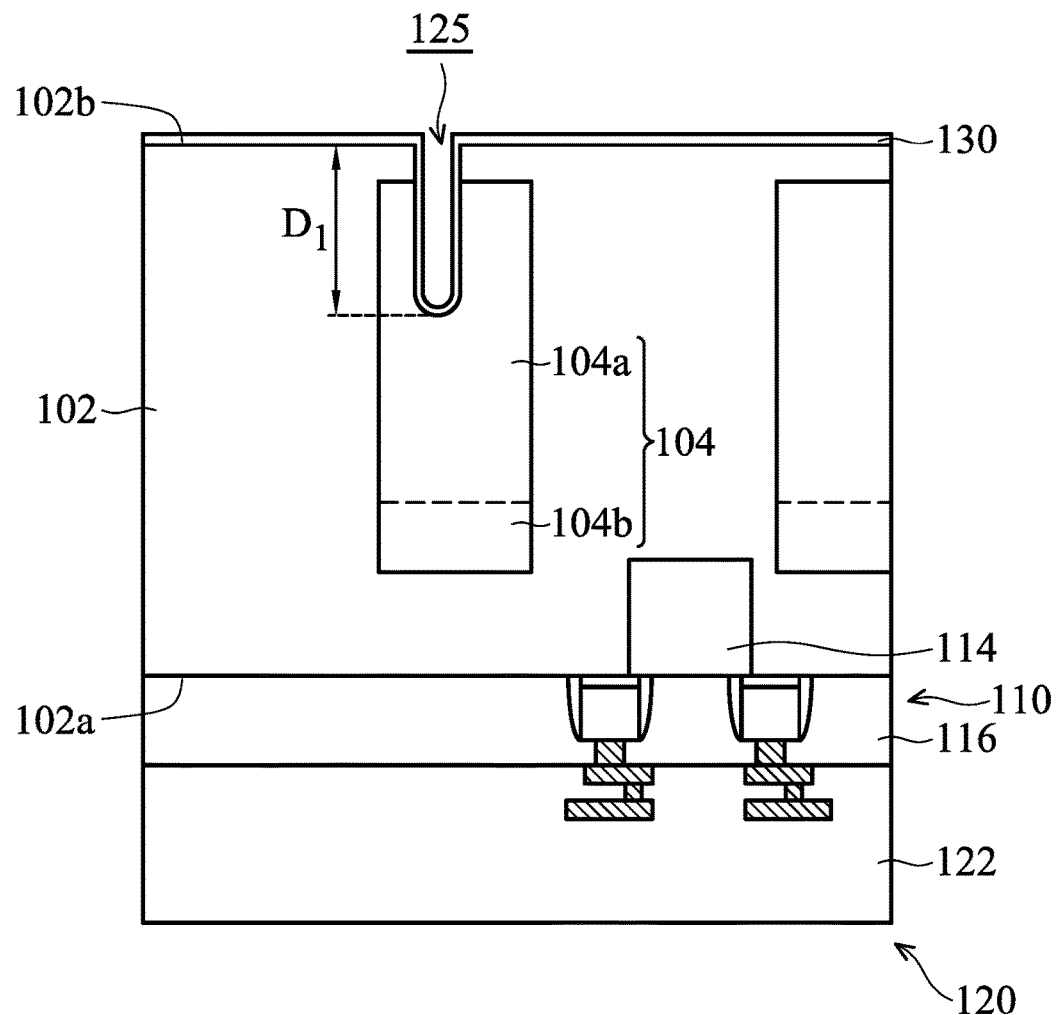
Figure 1E:
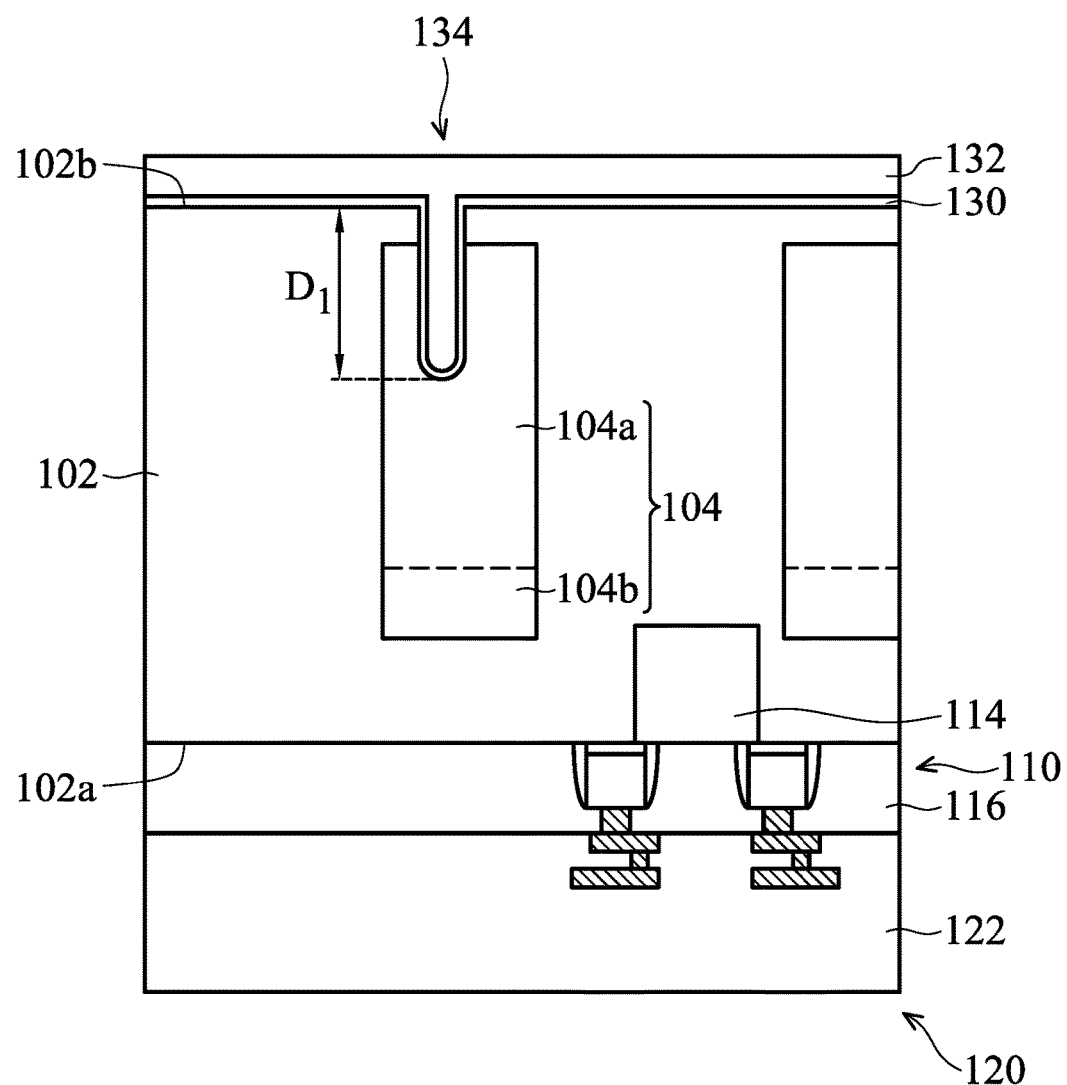

Next, as shown in FIG. 1D, a doping layer 130 is formed in a portion of the trench 125 and over the second surface 102b of the substrate 102, in accordance with some embodiments of the disclosure. The doping layer 130 is formed on sidewall surfaces of the trench 125, but the trench 125 is not completely filled with the doping layer 130. The doping layer 130 is in direct contact with the first portion 104a of the light-sensing region 104.

The doping layer 130 is doped with the first conductivity type. In some embodiments, the light-sensing region 104 is doped with n-type dopants, and the doping layer 130 is doped with p-type dopants. In some embodiments, the doping layer 130 is a boron (B)-doped Si layer. In some embodiments, the doping layer 130 has a doping concentration in a range from about 1E16 to about 1E20.

The doping layer 130 may be formed by an epitaxial process, a plasma doping process, or an atomic layer deposition (ALD) process. In some embodiments, the doping layer 130 is formed by an epitaxial process, and the epitaxial process is operated at a lower temperature in a range from about 400 degrees to about 500 degrees. The advantage of the epitaxial process is that the transistor device structure 110 is not damaged by the low temperature during performing the epitaxial process. In some other embodiments, the doping layer 130 is formed by a plasma doping process.

The plasma doping process includes performing a deposition process and simultaneously performing a knock-on process. The deposition process is configured to form a dopant layer in the trench 125. The knock-on process is configured to drive a dopant of the doping layer 130 into the trench 125. The knock-on process may include injecting a knock-on gas. The knock-on process is performed by using a gas comprising hydrogen ($H_2$), nitrogen ($N_2$), helium (He), argon (Ar), krypton (Kr), xenon (Xe), neon (Ne), or a combination thereof. In some other embodiments, the doping layer 130 may be formed by the atomic layer deposition (ALD) process, and a boron (B)-doped oxide layer is formed. In some embodiments, the doping layer 130 has a thickness in a range from about 5 nm to about 100 nm.

Subsequently, as shown in FIG. 1E, an oxide layer 132 is formed in the trench 125 and over the doping layer 130, in accordance with some embodiments of the disclosure. Therefore, a doping region 134 is formed by the doping layer 130 and the oxide layer 132. The doping layer 130 extends from the doping region 134 to a position which is in the deep isolation ring 136. The doping region 134 is inserted into or extended to the light-sensing region 104. More specifically, the doping region 134 is in direct contact with the first portion 104a of the light-sensing region 104.

In some embodiments, the light-sensing region 104 has an n-type conductivity, and the substrate 102 has a p-type conductivity. A first p-n junction is between the light-sensing region 104 and the substrate 102. In addition, the doping region 134 and the light-sensing region 104 have different doping conductivity type. In some embodiments, the light-sensing region 104 has an n-type conductivity, and the doping region 134 has a p-type conductivity. Therefore, a second p-n junction is between the doping region 134 and the light-sensing region 104. The light-sensing region 104 may be depleted rapidly by adding additional second p-n junction. More specifically, the doping region 134 is configured to increase the depleted ability of the light-sensing region 104 because the contacting area of the light-sensing region 104 and the doping region 134 is increased.

Figure 1F:
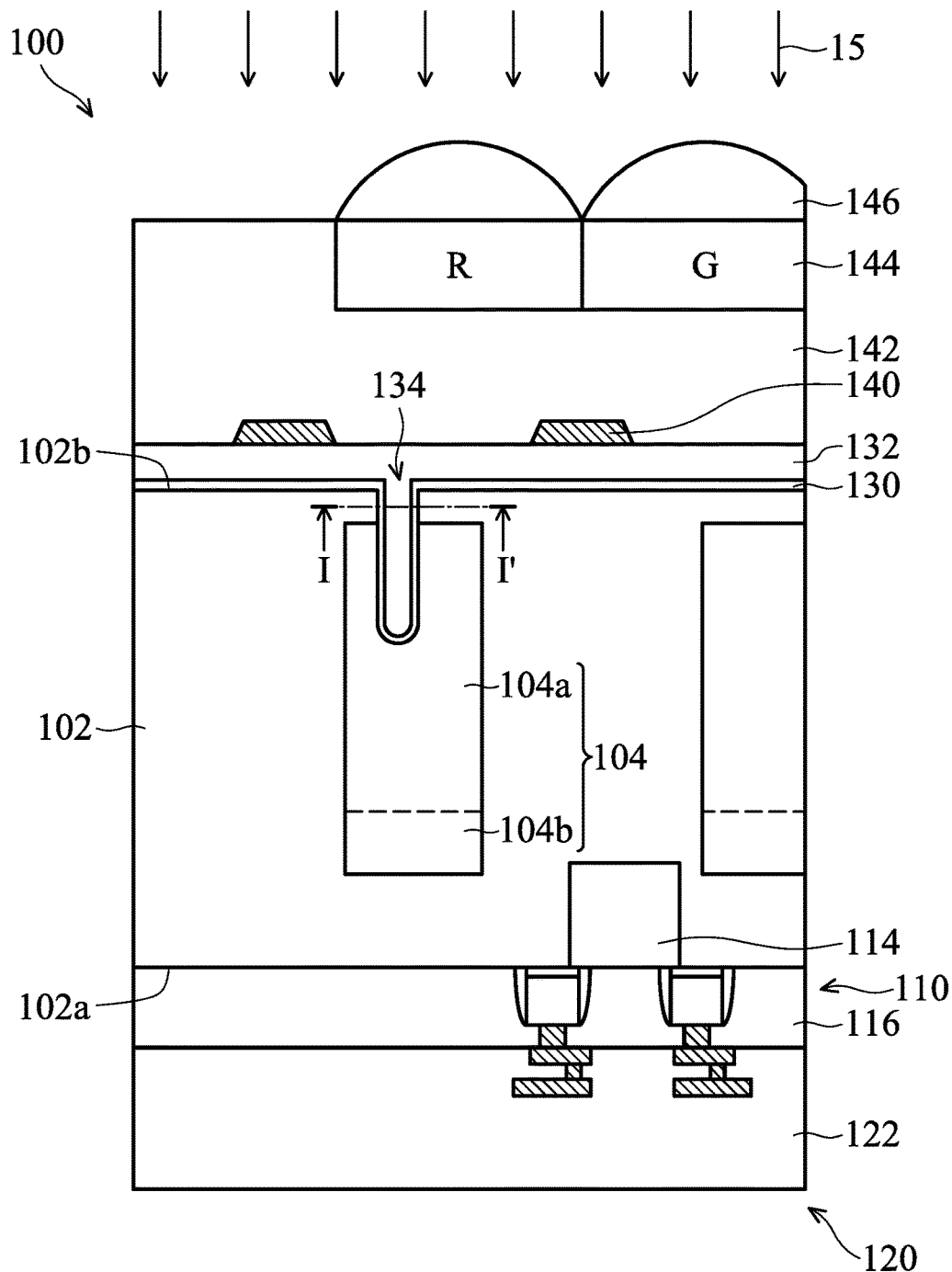

Afterwards, as shown in FIG. 1F, a number of metal grid structures 140 is formed over the oxide layer 132, in accordance with some embodiments of the disclosure.

The metal grid structures 140 are used to guide light towards the corresponding light-sensing region 104. The metal grid structures 140 are made of materials having reflective properties, which makes them capable of reflecting light. In some embodiments, the metal grid structures 140 are made of copper (Cu), tungsten (W), aluminum (Al), or another metal material. A dielectric layer 142 is formed on the metal grid structures 140 and on the oxide layer 132. The dielectric layer 142 is made of silicon nitride, silicon oxynitride, silicon oxide or combinations thereof. The dielectric layer 142 may have a single layer or multiple layers.

A number of color filters 144 are formed in the dielectric layer 142. Each of the metal grid structures 140 is formed below an interface region between two adjacent color filters 144. The color filters 144 aligned with the light-sensing region 104 are configured to filter visible light and allow light in the red (R), green (G) or blue (B) wavelength to pass through to the light-sensing region 104. The color filters 144 are made of dye-based (or pigment-based) polymer for filtering out a specific frequency band (for example, a desired wavelength of light). In some other embodiments, the color filters 144 are made of resins or other organic-based materials having color pigments.

A number of microlens structures 146 are formed over the color filters 144. The microlens structures 146 may have a variety of shapes and sizes depending on the index of refraction of the material used for the microlens structures 146. A light 15 is disposed over the second surface 102b of the substrate 102. The microlens structures 146 direct the light 15 to the respective color filters 144. Then, the light 15 passes through the color filters 144 to the corresponding the light-sensing region 104.

The doping region 134 is extended into the light-sensing region 104 to form an additional p-n junction and to increase the contacting area with the light-sensing region 104, and therefore the depleted ability of the light-sensing region 104 is improved.

If an anti-dome (AD) implant layer or stratification implant layer are formed in the substrate 102 in front-end-of-line (FEOL) process. Several implant layers are formed to form a pinning layer. However, the full well capacity (FWC) of the image sensor device structure is limited by the implant profile. The full well capacity (FWC) is a measurement of how much charges in the image sensor device may store before the charges overflow. The full well capacity (FWC)

determines the dynamic range of the image sensor device structure. A high full well capacity means that the respective image sensor device structure may have a great difference between the brightest level and darkest level of sensed signals.

In contrast to the implant region formed at front-end-of-line (FEOL) process, the doping region 134 of this embodiment is formed at a back-end-of-line (BEOL) process. The doping region 134 is closer to the second surface 102b of the substrate 102 than the first surface 102a of the substrate. In other words, the doping region 134 is formed at the backside of the substrate 102, rather than at the front side of the substrate 102. Therefore, the full well capacity (FWC) of the image sensor device structure 100 is increased since no several implant layers are formed at the first surface 102a of the substrate 102. Furthermore, the implant processes used in the front-end-of-line (FEOL) process may be reduced.

FIGS. 2A-2D show top-view representations of various image sensor device structure 100, in accordance with some embodiments of the disclosure. FIGS. 2A-2D show top-view representations along line II' of FIG. 1F.

Figure 2A:
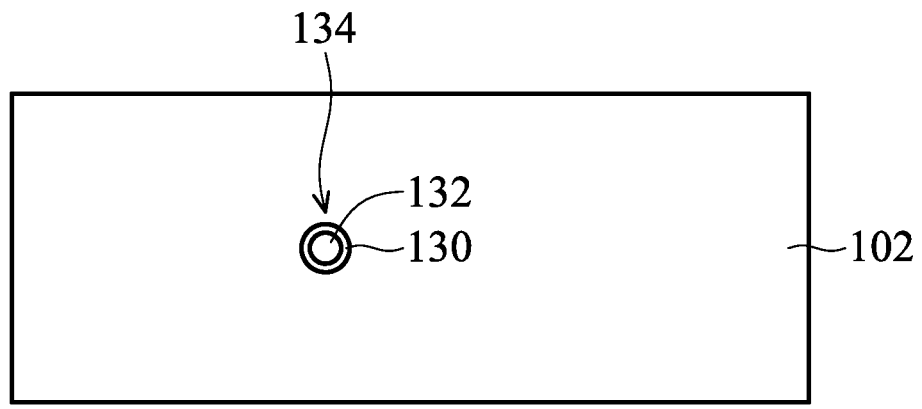
FIGS. 2A-2D show top-view representations of various image sensor device structure, in accordance with some embodiments of the disclosure.

As shown in FIG. 2A, the doping region 134 constructed by the doping layer 130 and the oxide layer 132 has a circle-shaped structure when seen from a top-view.

Figure 2B:
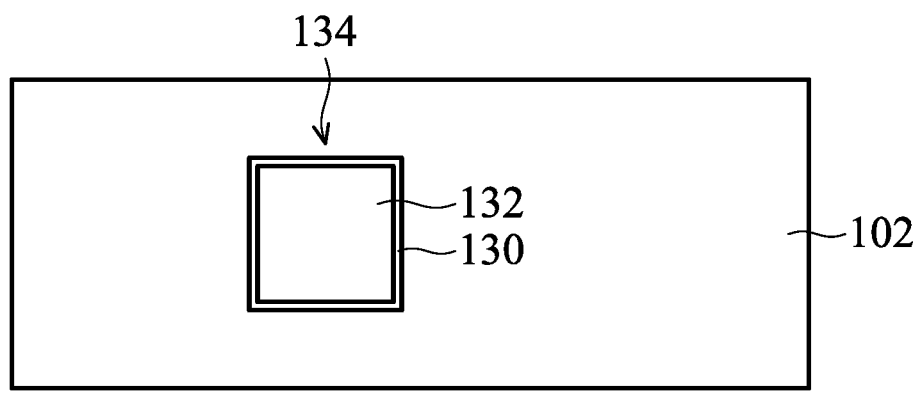
Figure 2C:
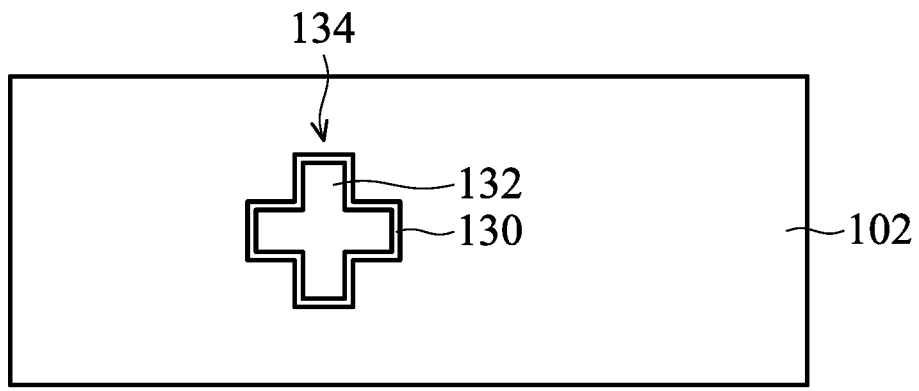
Figure 2D:
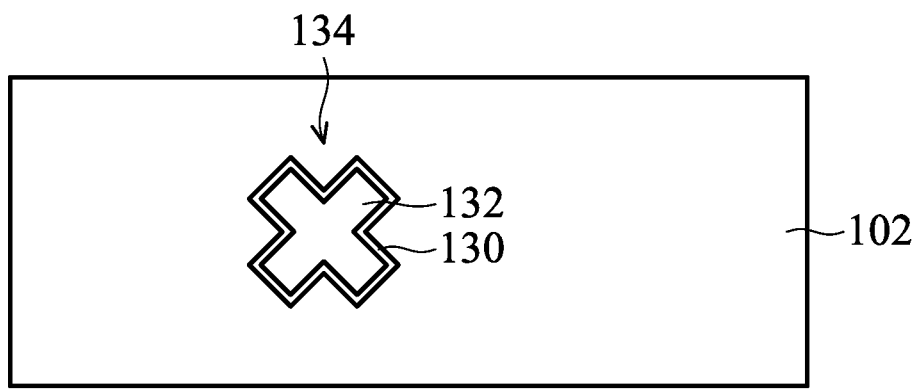

As shown in FIG. 2B, the doping region 134 may have a ring-shaped structure. As shown in FIG. 2C, the doping region 134 may have a plus-shaped structure. As shown in FIG. 2D, the doping region 134 may have a cross-shaped structure.

FIGS. 3A-3E show cross-sectional representations of various stages of forming an image sensor device structure 200a, in accordance with some embodiments of the disclosure. The image sensor device structure 200a is applied to a backside illuminated (BSI) image sensor device structure. Some processes and materials used to form the image sensor device structure 200a are similar to, or the same as, those used to form the image sensor device structure 100 and are not repeated herein. The difference between the second embodiment in FIGS. 3A-3E and the first embodiment in FIGS. 1A-1F is that additional deep isolation ring 136 surrounds the doping region 134.

Figure 3A:
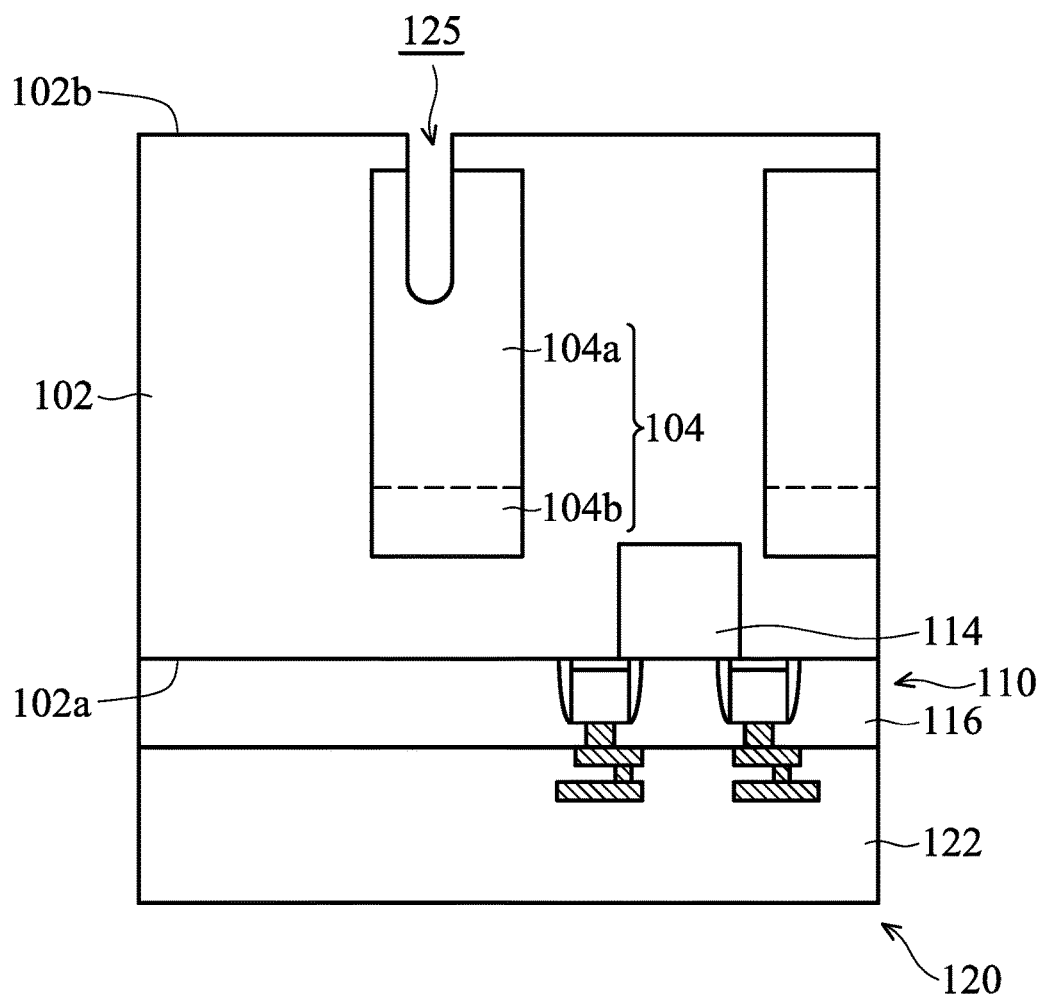
FIGS. 3A-3E show cross-sectional representations of various stages of forming an image sensor device structure, in accordance with some embodiments of the disclosure.

As shown in FIG. 3A, the substrate 102 has the first surface 102a and the second surface 102b. The transistor device structure 110 is formed over the first surface 102a of the substrate 102, and the interconnect structure 120 is formed over the transistor device structure 110. The trench 125 is formed in the light-sensing region 104 of the substrate 102. As a result, a portion of the first portion 104a of the light-sensing region 104 is exposed.

Figure 3B:
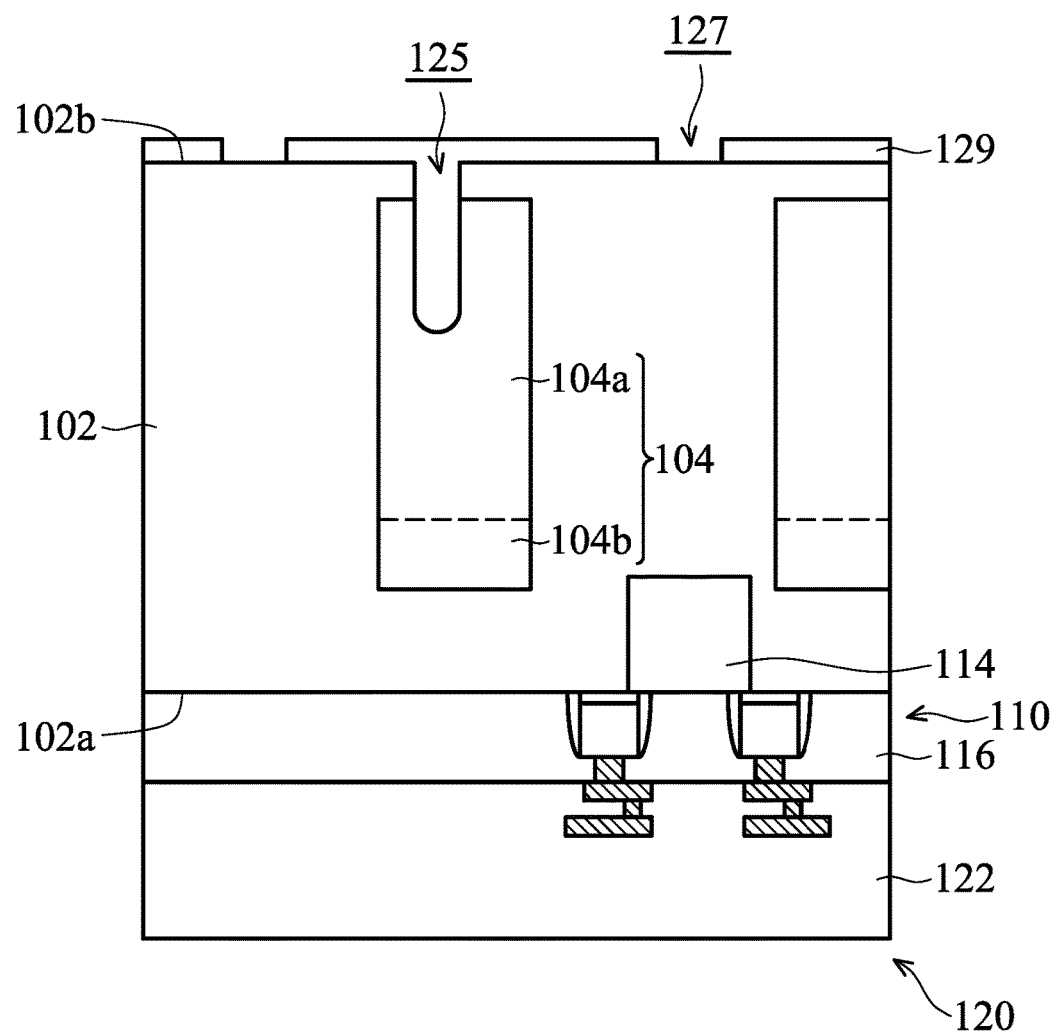

Afterwards, as shown in FIG. 3B, a mask layer 129 is formed over the second surface 102b of the substrate 102, and then the mask layer 129 is patterned to from a patterned mask layer 129, in accordance with some embodiments of the disclosure. Therefore, the patterned mask layer 129 has a number of openings 127 to expose the second surface 102b of the substrate.

Figure 3C:
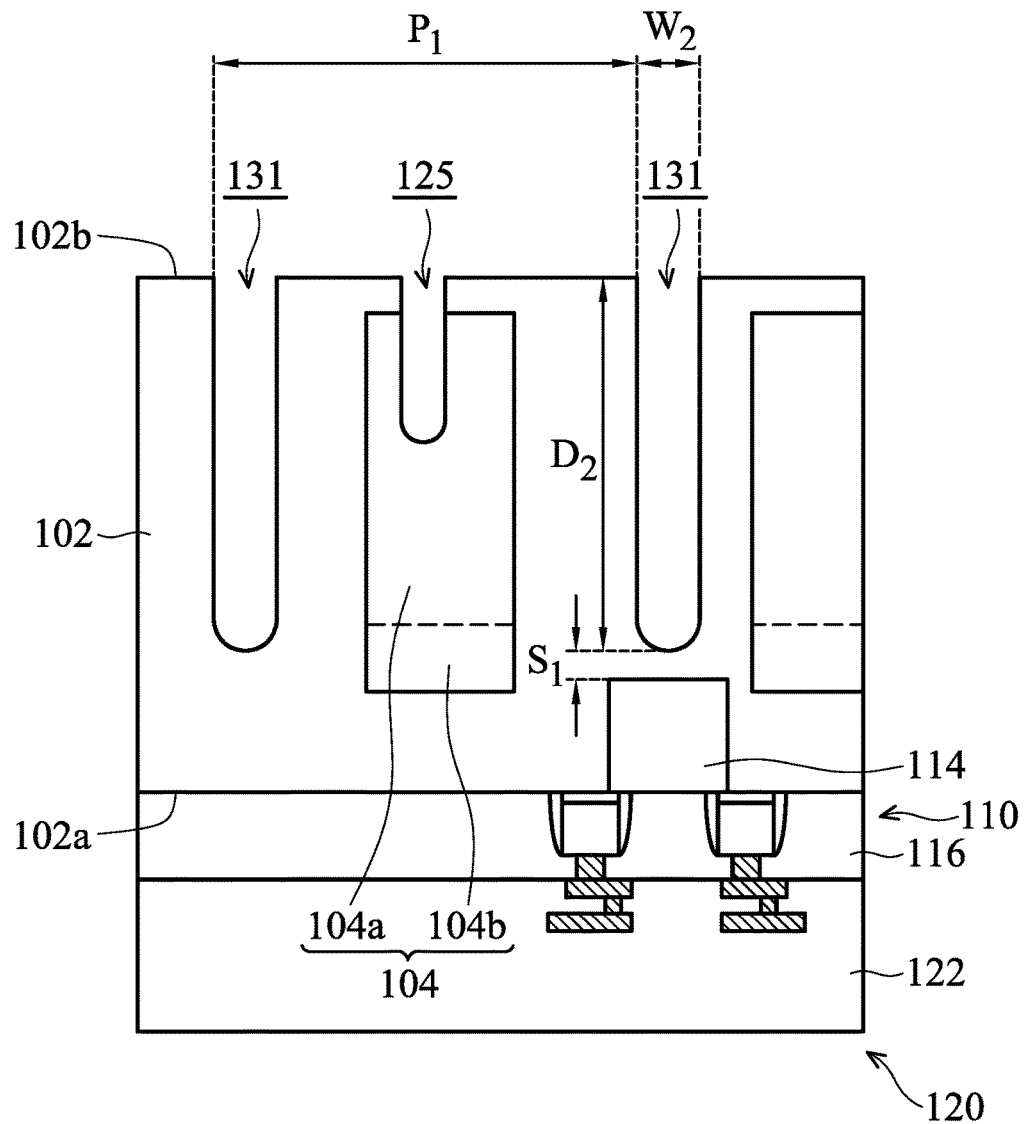

Next, as shown in FIG. 3C, a portion of the substrate 102 is removed to form a deep trench 131, in accordance with some embodiments of the disclosure. The portion of the substrate 102 is removed by using an etching process and using the patterned mask layer 129 as a mask. The trench 125 is surrounded by the deep trench 131. The deep trench 131 is used to isolate the adjacent light-sensing regions 114. The deep trench 131 has a ring-shaped structure when seen from a top view, and has two portions when seen from a cross-sectional view. There is a pitch $P_1$ between two portions of the deep trench 131. In some embodiments, the pitch $P_1$ is in a range from about 1 µm to about 3 µm.

The deep trench 131 has a second width $W_2$ which is measured along a horizontal direction, and the horizontal direction is parallel to the second surface 102b of the substrate 102. The deep trench 131 has a second depth $D_2$ which is measured from the second surface 102b of the substrate 102. The second depth $D_2$ is greater than the first depth $D_1$. In some embodiments, the second width $W_2$ is in a range from about 0.1 µm to about 0.4 µm. In some embodiments, the second depth $D_2$ is in a range from about 1 µm to about 5 µm. If the second depth $D_2$ is too small, the isolation effect of the deep isolation ring 136 (shown in FIG. 3D) may be degraded. If the second depth $D_2$ is too high, the deep isolation ring 136 may contact with the doping region 114.

In some embodiments, a portion of the deep trench 131 is directly above the doping region 114. There is a space $S_1$ between the bottom surface of the deep trench 131 and a top surface of the doping region 114. In some embodiments, the space $S_1$ is in a range from about 0.8 µm to about 3 µm.

Figure 3D:
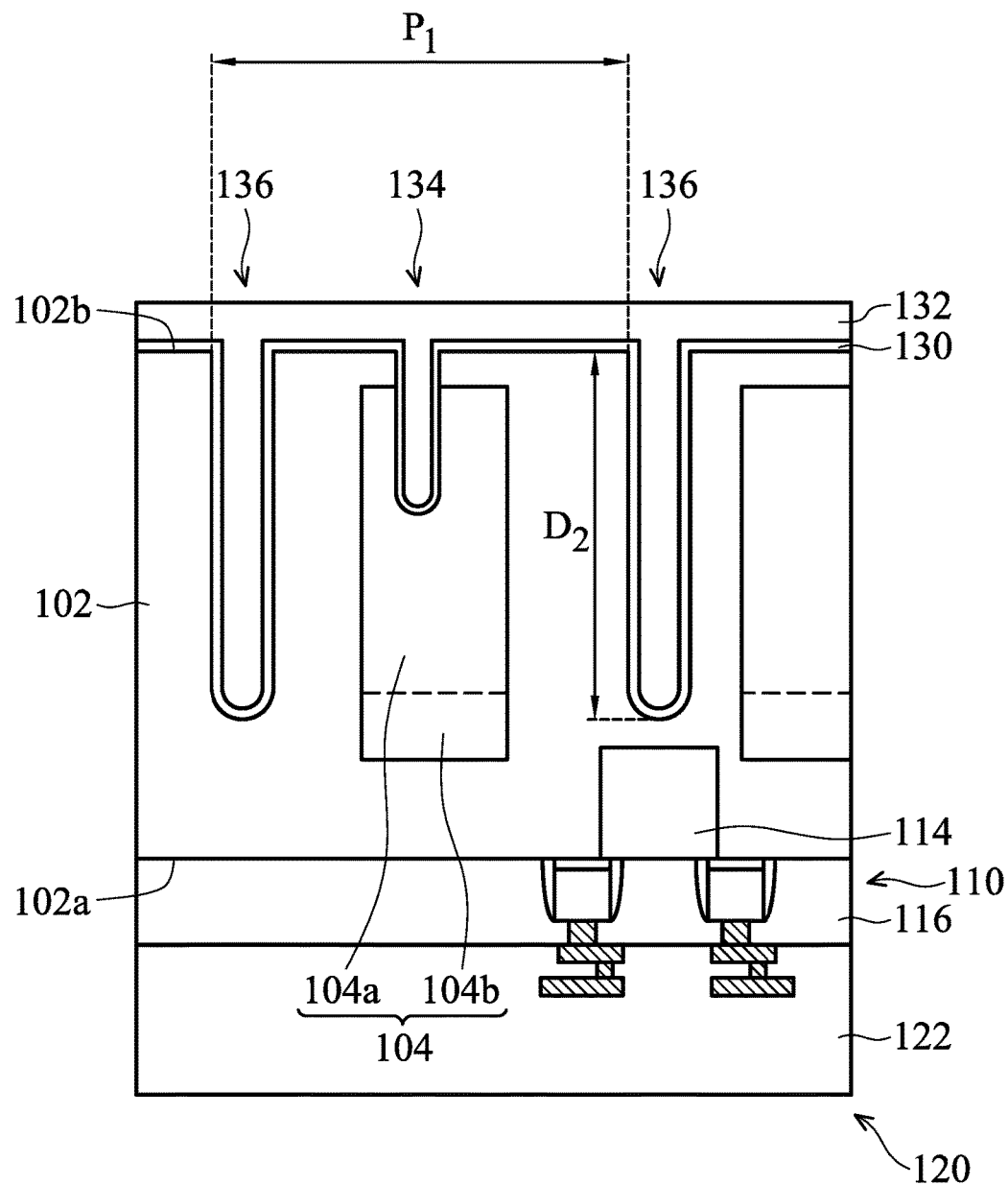

Subsequently, as shown in FIG. 3D, the doping layer 130 is formed in the sidewall surfaces of the trench 125 and the deep trench 131, and the oxide layer 132 is formed on the doping layer 130, in accordance with some embodiments of the disclosure. Therefore, the doping region 134 is formed by filling the trench 125 with the doping layer 130 and the oxide layer 132. Furthermore, a deep isolation ring 136 is formed by filling the deep trench 131 with the doping layer 130 and the oxide layer 132. The doping region 134 is surrounded by the deep isolation ring 136. The adjacent light-sensing regions 104 are isolated and separated by the deep isolation ring 136.

In some embodiments, the doping layer 130 is doped with p-type dopants, and the light-sensing region 104 is doped with n-type dopants. In some embodiments, the doping layer 130 is formed by doping with boron (B) at a concentration in a range from about 1E19 to about 1E20. The substrate 102 is doped with p-type dopants, and the doping concentration of the doping layer 130 of the deep isolation ring 136 is greater than the doping concentration of the substrate 102.

Figure 3E:
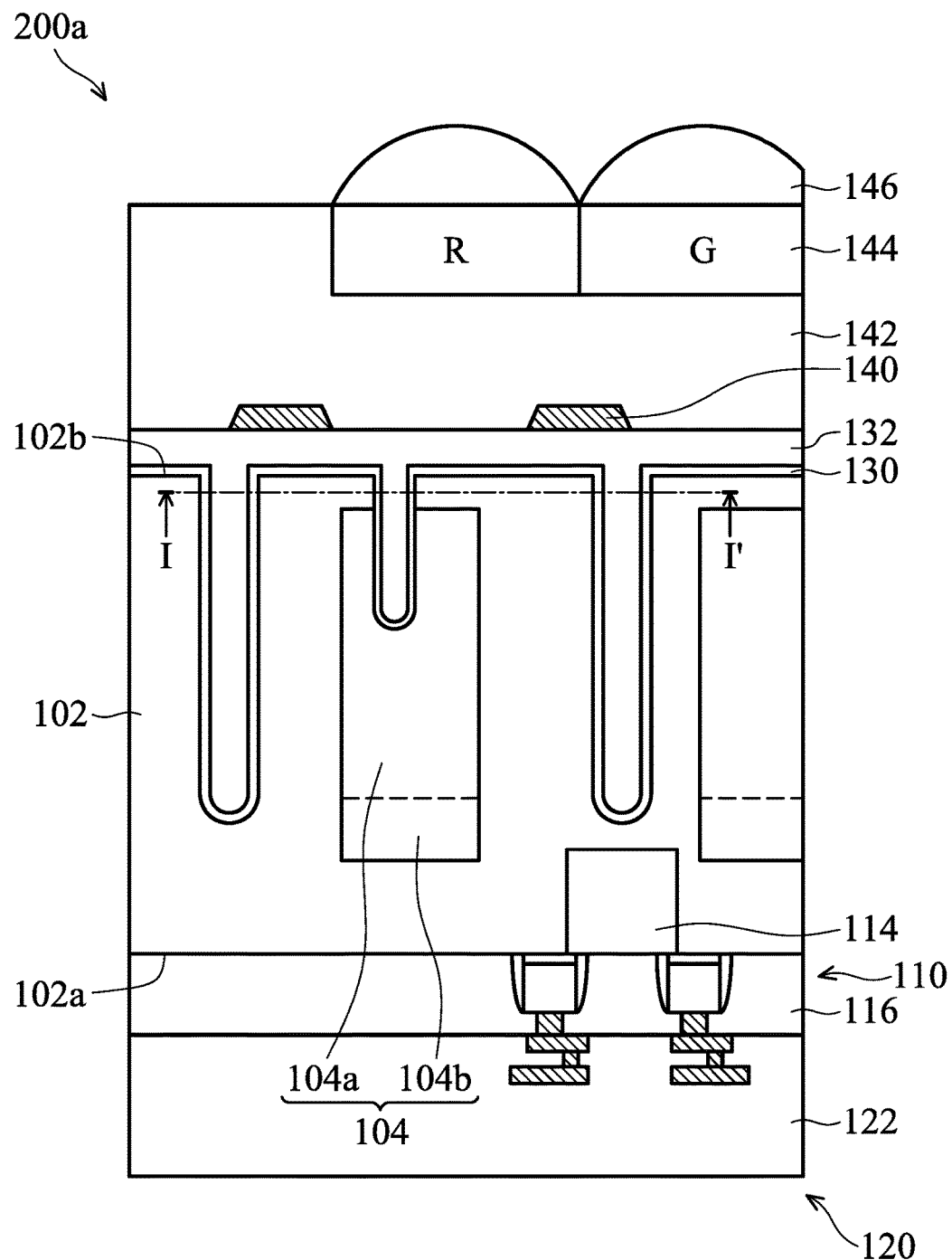
Figure 3E:
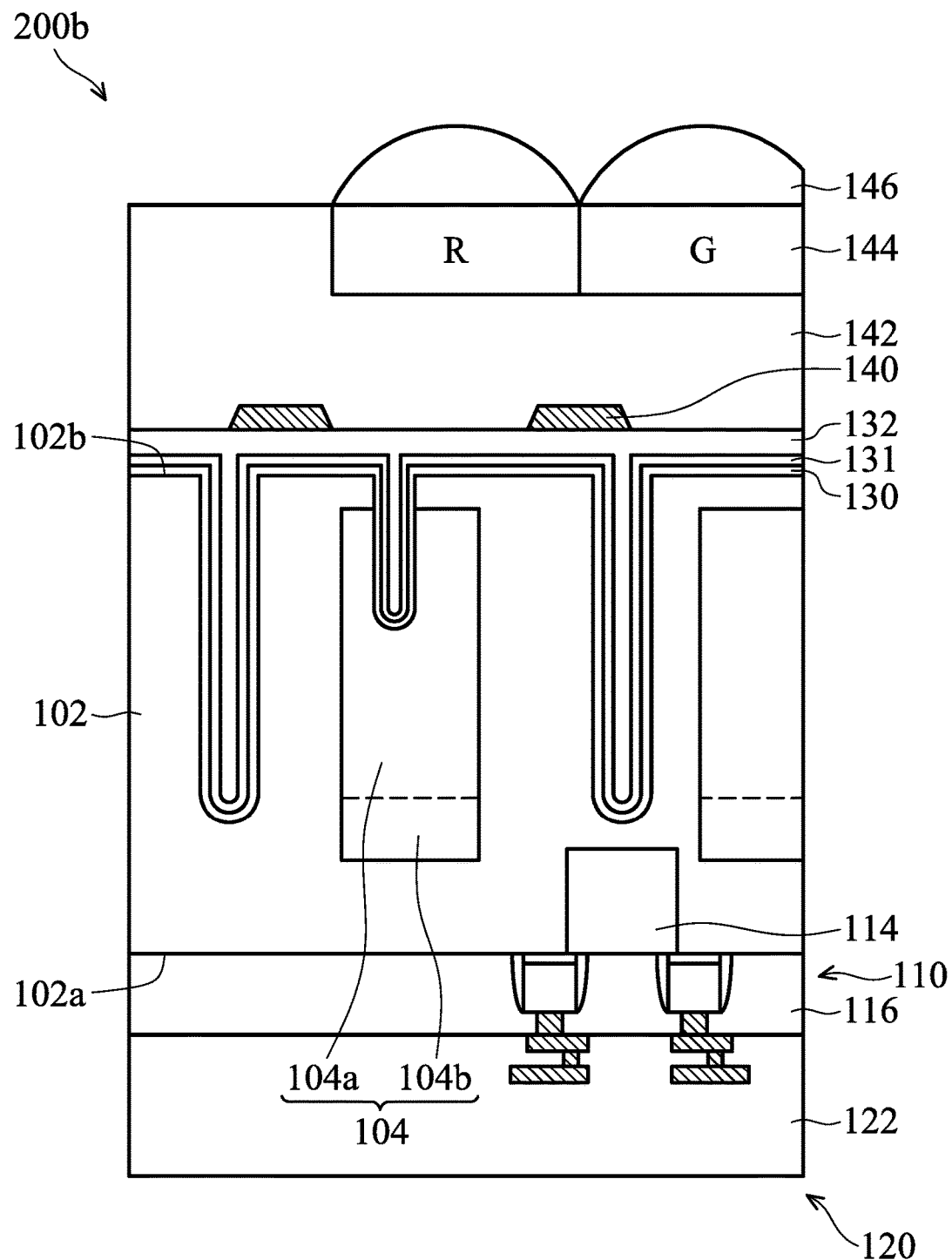

Next, as shown in FIG. 3E, the metal grid structures 140 are formed over the oxide layer 132, and the dielectric layer 142 is formed over the oxide layer 132 and the metal grid structures 140, in accordance with some embodiments of the disclosure. The color filters 144 are formed in the dielectric layer 142, and the microlens structures 146 are formed over the color filters 144.

The advantage of the second embodiment is that the doping region 134 and the deep isolation ring 136 are simultaneously formed. The process for forming the doping region 134 is compatible with the process for forming the deep isolation ring 136. Therefore, the fabrication time and cost are reduced.

FIG. 3E' shows a cross-sectional representation of a modified image sensor device structure 200b, in accordance with some embodiments of the disclosure. The difference between FIG. 3E' and FIG. 3E is that additional high-k dielectric layer 131 is between the doping layer 130 and the oxide layer 132. The high-k dielectric layer 131 is used to repair the damage of the substrate 102 since the substrate 102 may be damaged during forming the trench 125 and the deep trench 131. Therefore, the doping region 134 has three-layered structure.

Figure 4A:
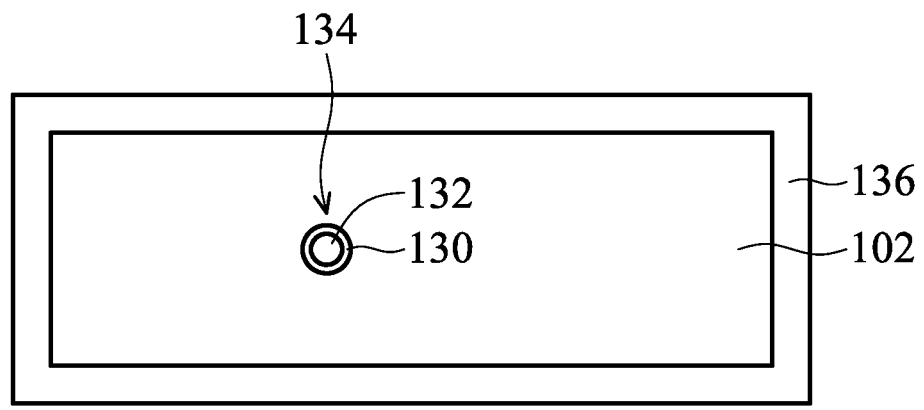
FIGS. 4A-4C show top-view representations of various image sensor device structure, in accordance with some embodiments of the disclosure.
Figure 4B:
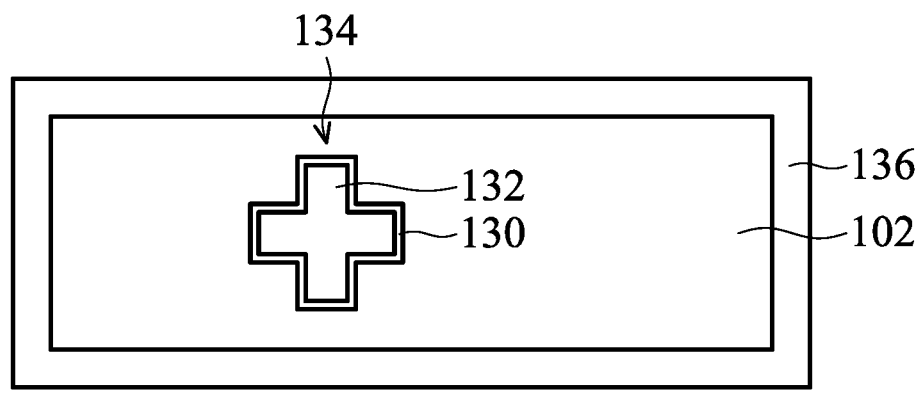
Figure 4C:
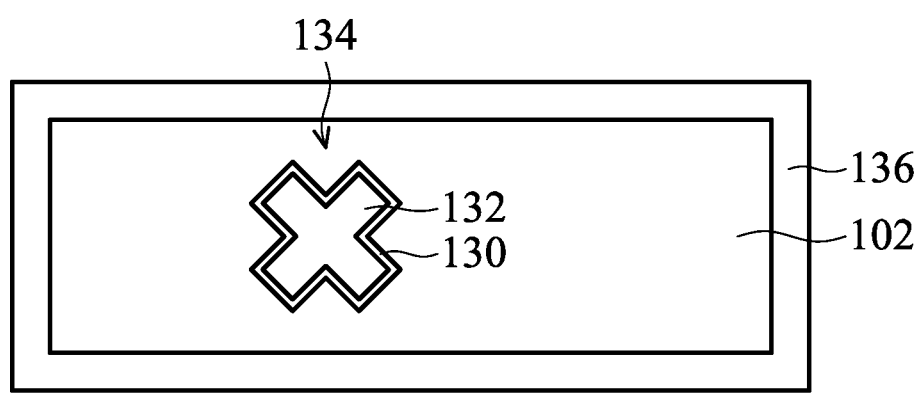

FIGS. 4A-4C show top-view representations of various image sensor device structure 100, in accordance with some embodiments of the disclosure. FIGS. 4A-4C show top-view representations along line II' of FIG. 3E.

As shown in FIG. 4A, the doping region 134 constructed by the doping layer 130 and the oxide layer 132 has a circle-shaped structure when seen from a top-view. The doping region 134 is surrounded by the deep isolation ring 136. As shown in FIG. 4B, the doping region 134 may have a plus-shaped structure. As shown in FIG. 4C, the doping region 134 may have a cross-shaped structure.

FIGS. 5A-5F show cross-sectional representations of various stages of forming an image sensor device structure 300a, in accordance with some embodiments of the disclosure. The image sensor device structure 300a is applied to a backside illuminated (BSI) image sensor device structure. Some processes and materials used to form the image sensor device structure 300a are similar to, or the same as, those used to form the image sensor device structure 100 and are not repeated herein.

Figure 5A:
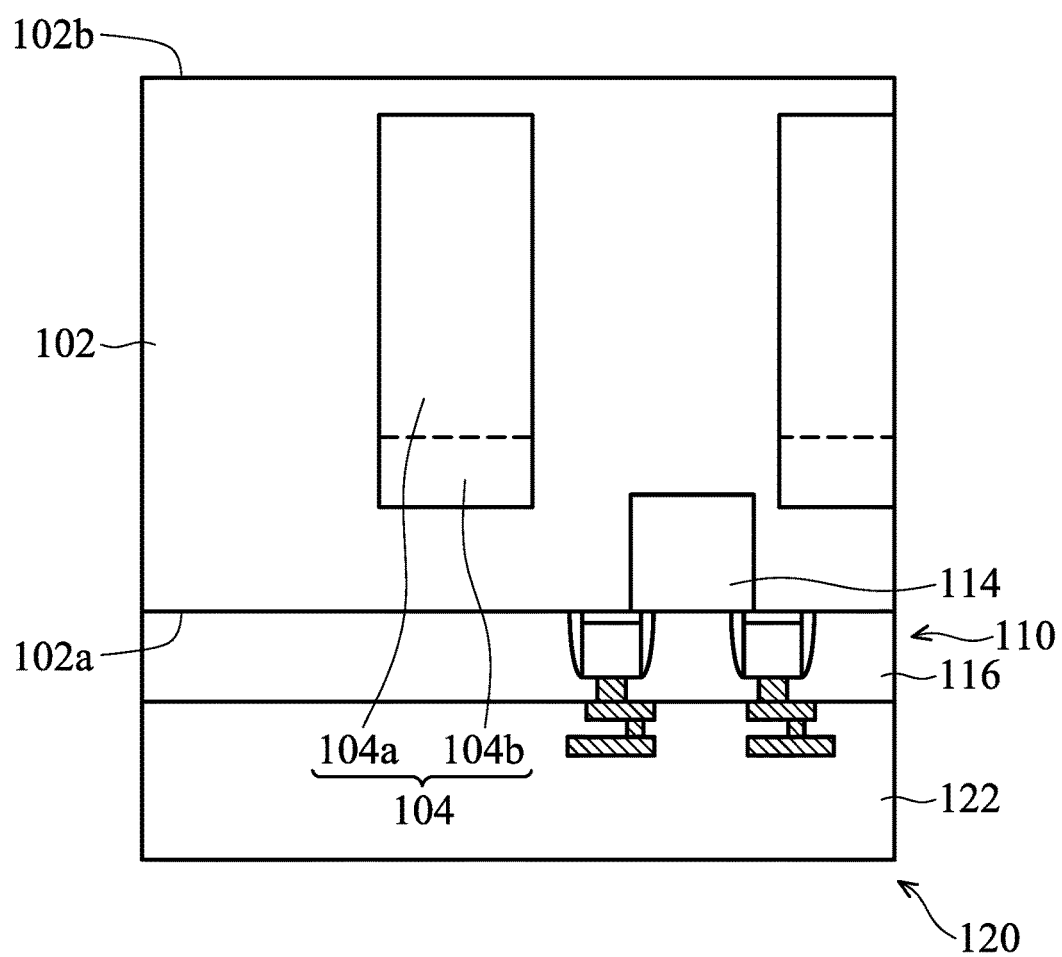
FIGS. 5A-5F show cross-sectional representations of various stages of forming an image sensor device structure, in accordance with some embodiments of the disclosure.

As shown in FIG. 5A, the substrate 102 has the first surface 102a and the second surface 102b. The transistor device structure 110 is formed over the first surface 102a of the substrate 102, and the interconnect structure 120 is formed over the transistor device structure 110.

Figure 5B:
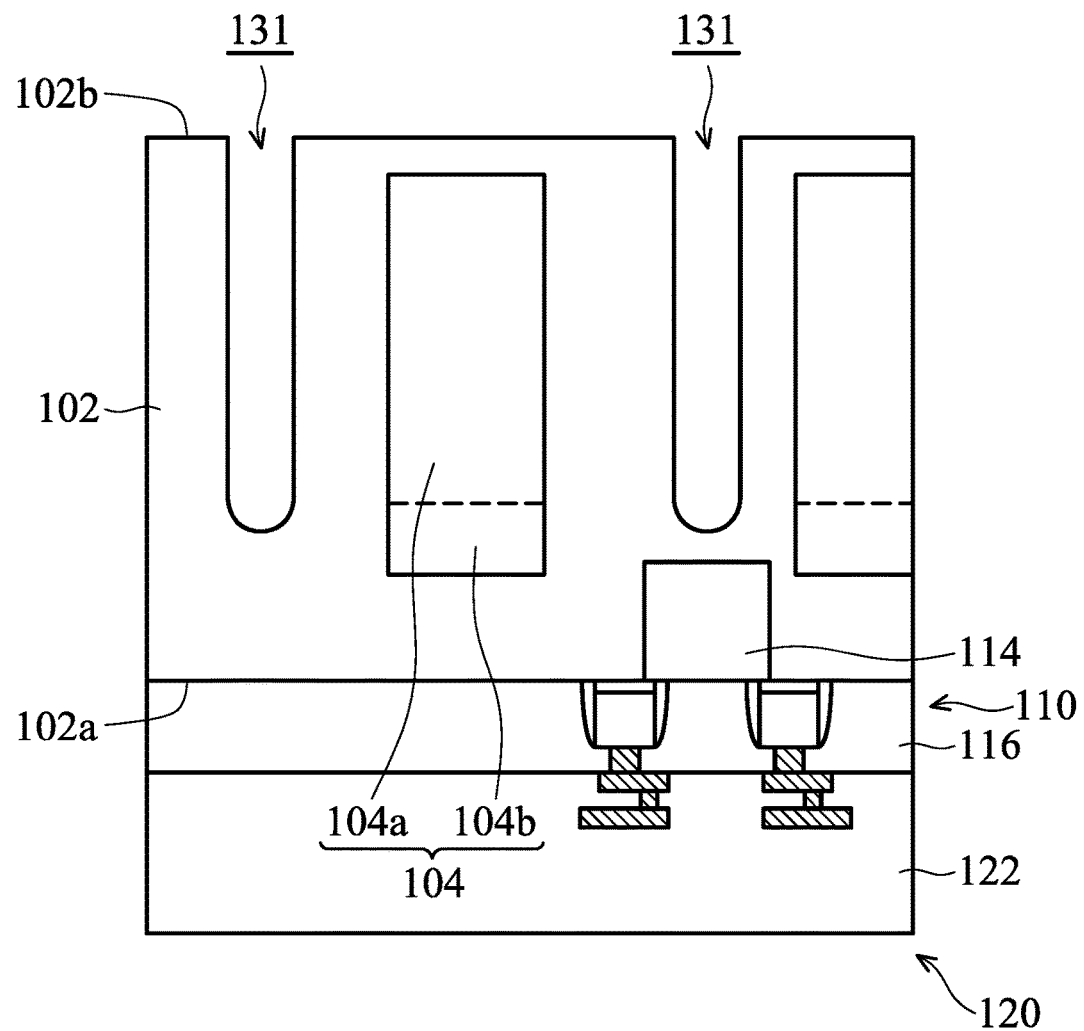

Afterwards, as shown in FIG. 5B, a deep trench 131 is formed in the substrate 102, in accordance with some embodiments of the disclosure. The deep trench 131 has ring-shaped structure when seen from a top-view.

Figure 5C:
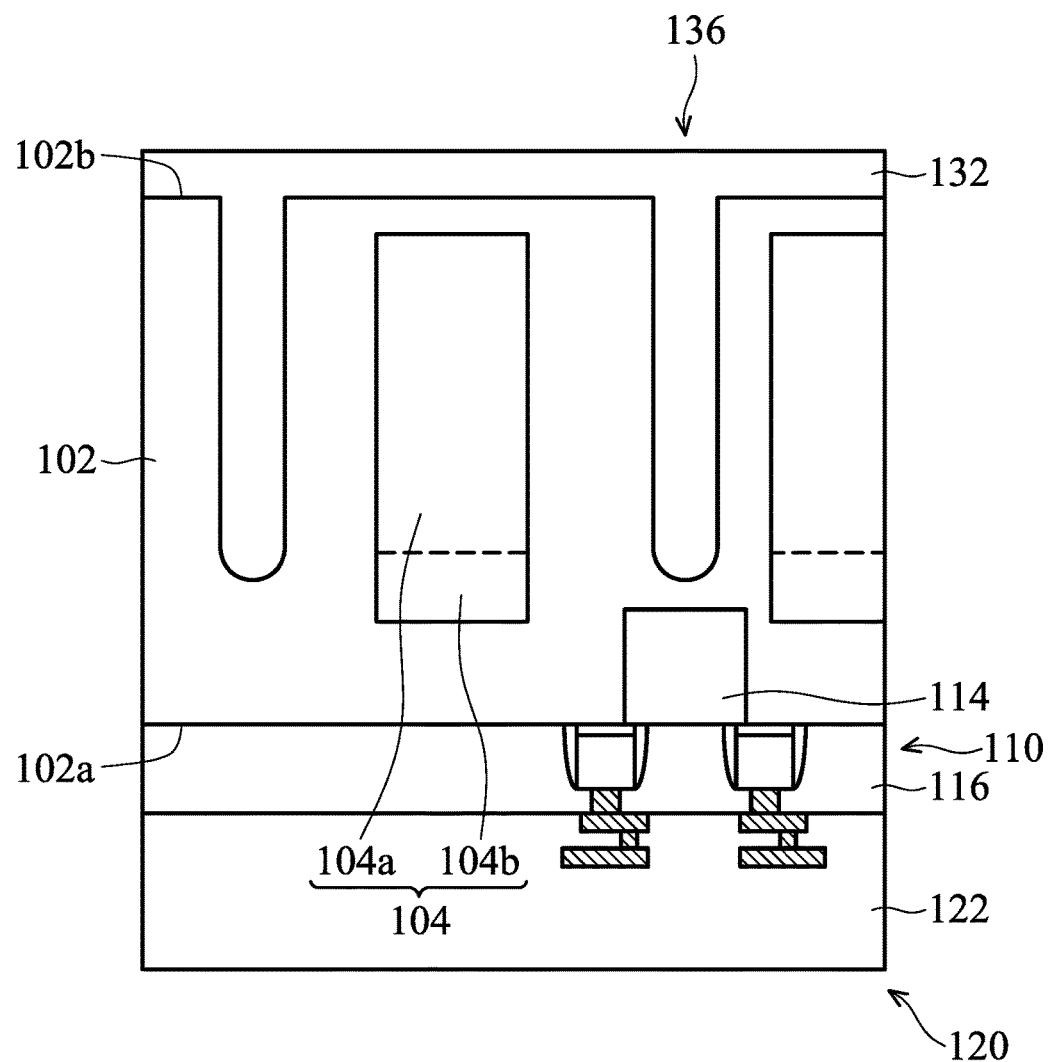

Next, as shown in FIG. 5C, the oxide layer 132 is formed in the deep trench 131 to form the deep isolation ring 136, in accordance with some embodiments of the disclosure. The deep isolation ring 136 surrounds the light-sensing region 104.

Figure 5D:
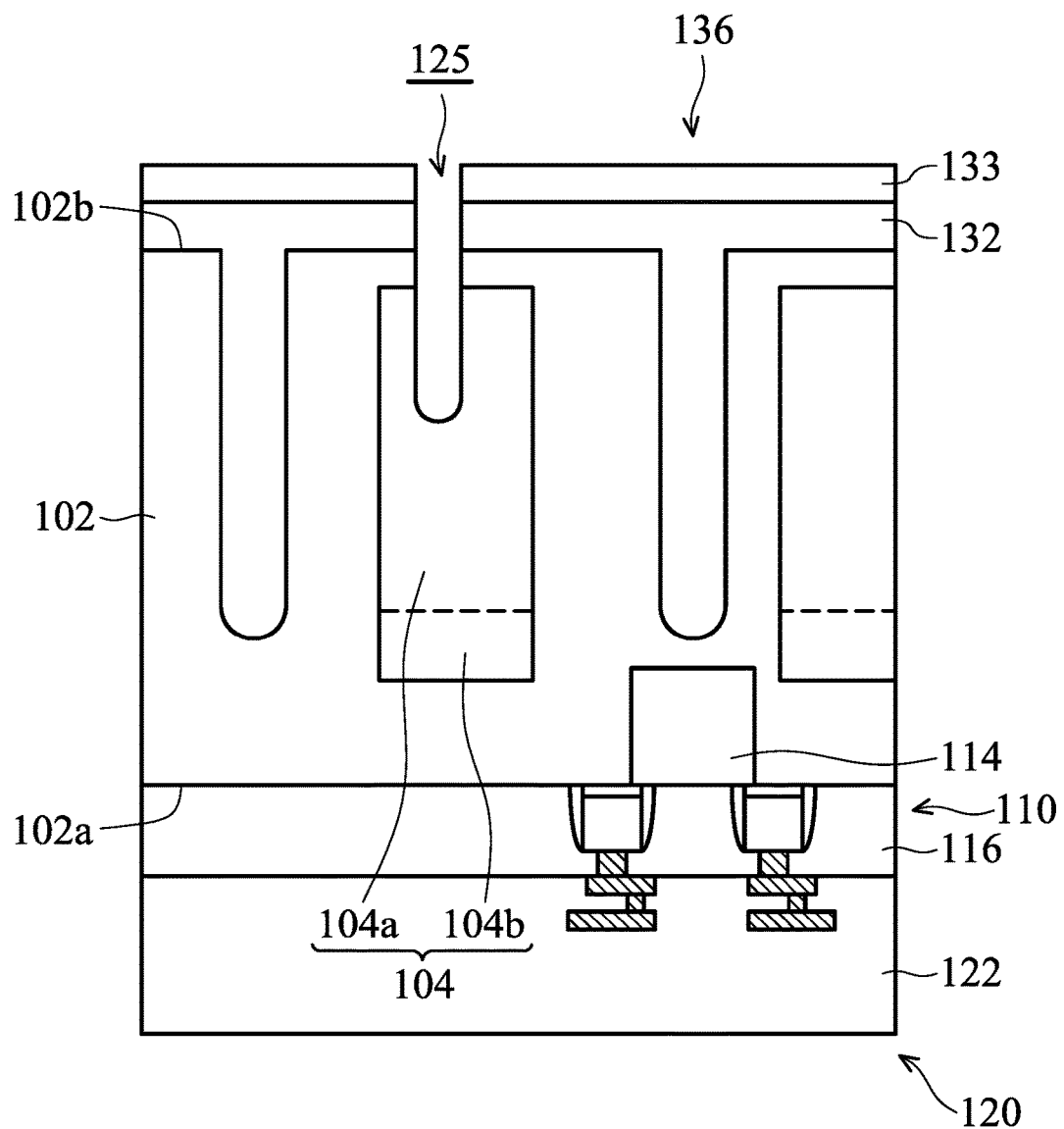

Subsequently, as shown in FIG. 5D, a mask layer 133 is formed over the oxide layer 132, and the mask layer 133 is patterned to form a patterned mask layer 133, in accordance with some embodiments of the disclosure. The patterned mask layer 133 is used to define the location of the trench 125. A portion of the substrate 102 is removed by using the patterned mask layer 133 as a mask to form the trench 125.

Figure 5E:
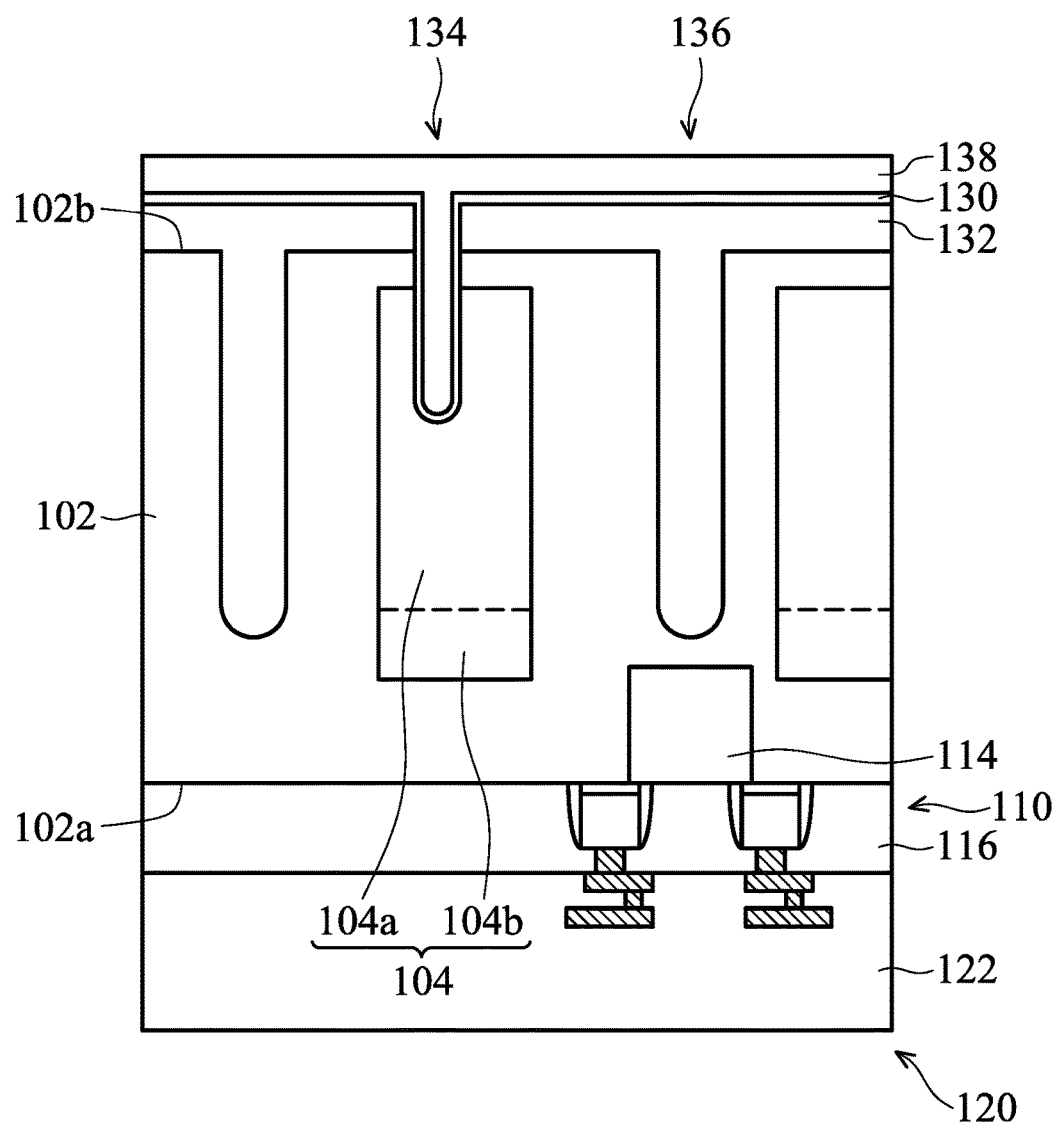

Next, as shown in FIG. 5E, the doping layer 130 and the oxide layer 138 are formed in the trench 125, in accordance with some embodiments of the disclosure. As a result, the doping region 134 is constructed by the doping layer 130 and the oxide layer 138. In addition, the doping region 134 is surrounded by the deep isolation ring 136. The doping layer 130 is between the oxide layer 132 and the oxide layer 138.

Figure 5F:
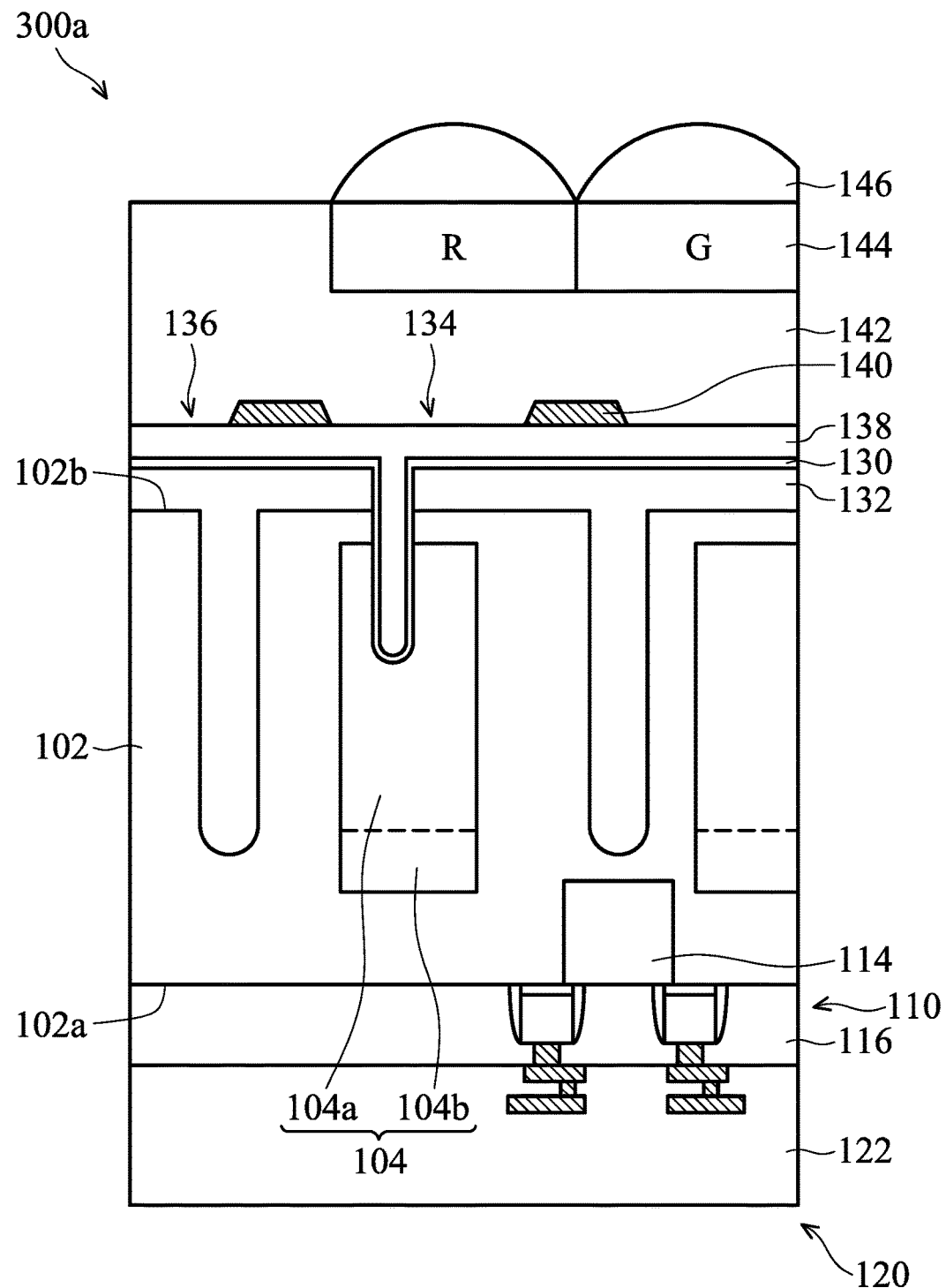
Figure 5F:
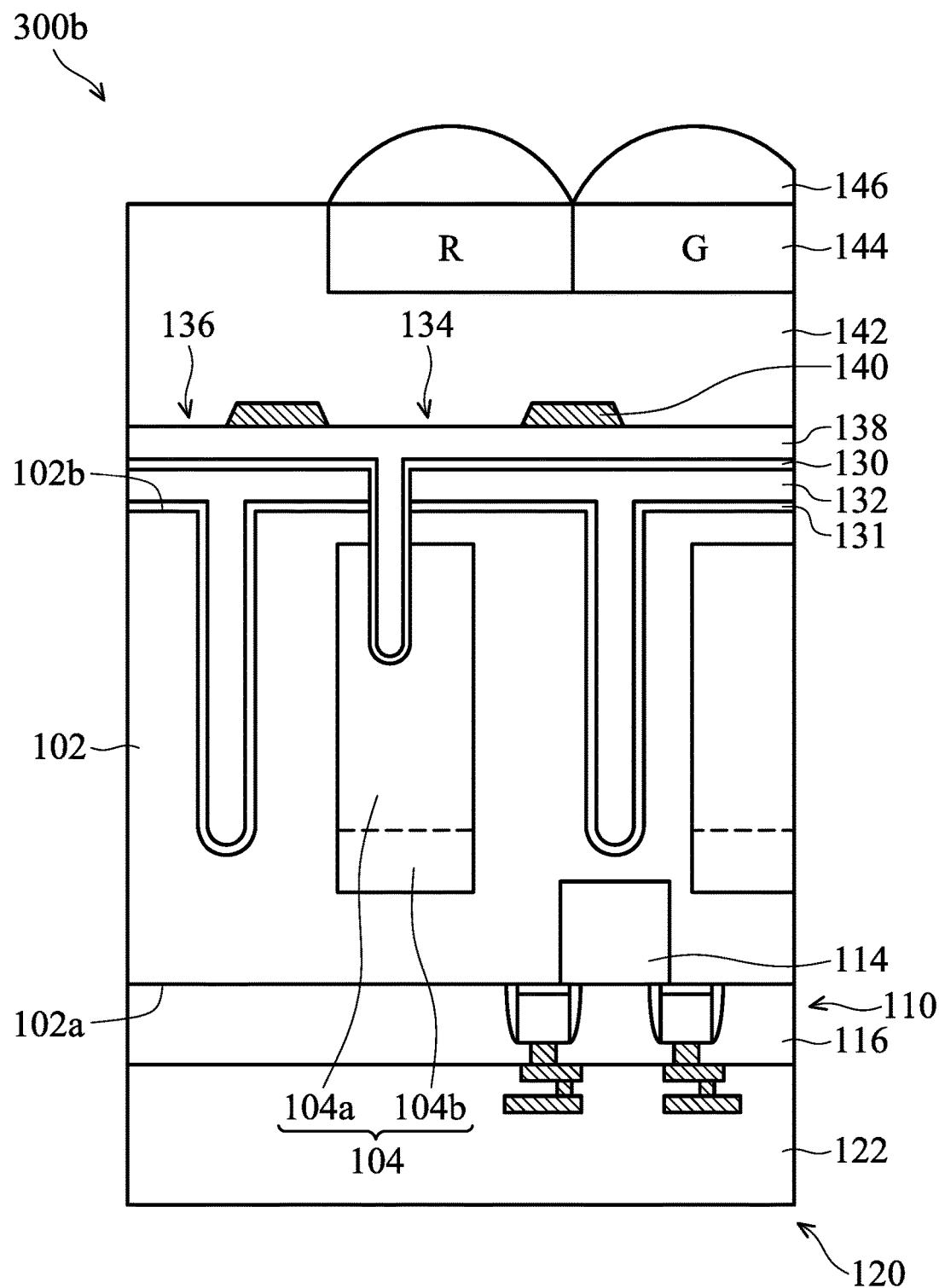

Next, as shown in FIG. 5F, the metal grid structures 140 are formed over the oxide layer, and the dielectric layer 142 is formed over the oxide layer 132 and the metal grid structures 140, in accordance with some embodiments of the disclosure. The color filters 144 are formed in the dielectric layer 142, and the microlens structures 146 are formed over the color filters 144.

FIG. 5F' shows a cross-sectional representation of a modified image sensor device structure 300b, in accordance with some embodiments of the disclosure. The difference between FIG. 5F' and FIG. 5F is that the oxide layer 132 is between the doping layer 130 and the additional high-k dielectric layer 131. The high-k dielectric layer 131 is used to repair the damage of the substrate 102 since the substrate 102 may be damaged during forming the trench 125 and the deep trench 131. Therefore, the doping region 134 has three-layered structure.

The depleted ability of the light-sensing region 104 is improved by forming the doping region in the light-sensing region. Thus, the sensitivity of the light-sensing region 104 is improved. Furthermore, the doping region 134 is formed in BEOL without forming a complicated photodiode implant region at the first surface of the substrate. Therefore, the full-well capacity (FWC) of the image sensor device structure is improved.

Embodiments for forming an image sensor device structure are provided. The image sensor device structure is applied to a backside illuminated (BSI) image sensor device structure. The light-sensing region with a second conductivity type is formed in a substrate with a first conductivity type to form a first p-n junction. An additional p-n junction is formed by using doping region with the first conductivity type inserted into the light-sensing region with the second conductivity type. The depleted ability of the light-sensing region is improved by the additional p-n junction. Furthermore, a deep isolation ring surrounds the light-sensing region to isolate the adjacent light-sensing regions. The doping region and the deep isolation ring are formed simultaneously to reduce the fabrication steps. Therefore, the sensitivity and the performance of the image sensor device structure are improved by forming the doping region in the light-sensing region.

In some embodiments, an image sensor device structure is provided. The image sensor device structure includes a substrate, and the substrate is doped with a first conductivity type. The image sensor device structure includes a light-sensing region formed in the substrate, and the light-sensing region is doped with a second conductivity type that is different from the first conductivity type. The image sensor device structure further includes a doping region extended into the light-sensing region, and the doping region is doped with the first conductivity type. The image sensor device structure also includes a plurality of color filters formed on the doping region.

In some embodiments, an image sensor device structure is provided. The image sensor device structure includes a p-type substrate, and the p-type substrate has a first surface and a second surface. The image sensor device structure also includes an interconnect structure formed on the first surface of the p-type substrate and an n-type light-sensing region formed in the substrate. The image sensor device structure includes a p-type doping region inserted into the n-type light-sensing region from the second surface of the substrate, and the p-type doping region includes a p-type doping layer and an oxide layer formed over the p-type doping layer. The image sensor device structure includes a deep isolation ring surrounding the n-type light-sensing region, and the deep isolation ring includes the p-type doping layer and the oxide layer.

In some embodiments, a method for forming an image sensor device structure is provided. The method includes forming an interconnect structure on a first surface of a substrate and forming a light-sensing region in the substrate. The method also includes forming a trench in the light-sensing region from a second surface of the substrate and forming a doping layer in the trench. The method further includes forming an oxide layer in the trench and on the doping layer to form a doping region, and the doping region is inserted into the light-sensing region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device structure, comprising:
   a substrate, wherein the substrate is doped with a first conductivity type;
   a light-sensing region formed in the substrate, wherein the light-sensing region is doped with a second conductivity type that is different from the first conductivity type;
   a doping region extended into the light-sensing region, wherein the doping region is doped with the first conductivity type, and the doping region comprises an inner oxide layer and an outer doping layer, and the outer doping layer is between the inner oxide layer and the light-sensing region; and
   a plurality of color filters formed on the doping region.

2. The image sensor device structure as claimed in claim 1, wherein the substrate is doped with p-type conductivity, the light-sensing region is doped with n-type conductivity, and the doping region is doped with p-type conductivity.

3. The image sensor device structure as claimed in claim 1, wherein the light-sensing region comprises a first portion with a first doping concentration and a second portion with a second doping concentration, the first portion is closer to the doping region than the second portion, the second doping concentration is higher than the first doping concentration, and the doping region is in direct contact with the first portion.

4. The image sensor device structure as claimed in claim 3, wherein the doping region has a third doping concentration, and the third doping concentration is higher than the second doping concentration.

5. The image sensor device structure as claimed in claim 1, further comprising:
   a deep isolation ring surrounding the light-sensing region, wherein the doping region has a first depth, and the deep isolation ring has a second depth which is greater than the first depth.

6. The image sensor device structure as claimed in claim 5, wherein the deep isolation ring comprises:
   a doping layer, wherein the doping layer is doped with the first conductivity type, and the doping layer is in direct contact with the substrate; and
   an oxide layer over the doping layer.

7. The image sensor device structure as claimed in claim 6, wherein the deep isolation ring further comprises a high-k dielectric layer between the doping layer and the oxide layer.

8. The image sensor device structure as claimed in claim 1, further comprising:
   a transistor device formed over the substrate; and
   an interconnect structure formed on the transistor device.

9. The image sensor device structure as claimed in claim 1, further comprising:
   a plurality of metal grid structures over the oxide layer and the light-sensing region, wherein the metal grid structures are between the doping region and the color filters.

10. An image sensor device structure, comprising:
    a p-type substrate, wherein the p-type substrate has a first surface and a second surface;
    an interconnect structure formed on the first surface of the p-type substrate;
    an n-type light-sensing region formed in the substrate;
    a p-type doping region inserted into the n-type light-sensing region from the second surface of the substrate, wherein the p-type doping region comprises a p-type doping layer and an oxide layer formed over the p-type doping layer; and
    a deep isolation ring surrounding the n-type light-sensing region, wherein the deep isolation ring comprises the p-type doping layer and the oxide layer.

11. The image sensor device structure as claimed in claim 10, wherein the doping region has a first depth, and the deep isolation ring has a second depth which is greater than the first depth.

12. The image sensor device structure as claimed in claim 10, further comprising:
    a plurality of color filters formed on the oxide layer; and
    a plurality of microlens structure formed on the color filters.

13. The image sensor device structure as claimed in claim 10, wherein the deep isolation ring further comprises the oxide layer over the p-type doping layer.

14. The image sensor device structure as claimed in claim 10, wherein the deep isolation ring further comprises a high-k dielectric layer between the p-type doping layer and the oxide layer.

15. The image sensor device structure as claimed in claim 10, wherein the n-type light-sensing region comprises a first portion with a first doping concentration and a second portion with a second doping concentration, the first portion is closer to the p-type doping region than the second portion, the second doping concentration is higher than the first doping concentration, and the p-type doping region is in direct contact with the first portion.

16. The image sensor device structure as claimed in claim 10, further comprising:
    a transistor device structure formed over the first surface of the p-type substrate; and
    an n-type floating node region formed in the p-type substrate, wherein a portion of the deep isolation ring is directly above the n-type floating node region.

17. An image sensor device structure, comprising:
    a substrate, wherein the substrate has a first surface and a second surface;
    an interconnect structure formed on the first surface of the substrate;
    a light-sensing region formed in the substrate;
    a doping region inserted into the light-sensing region, wherein the doping region comprises a doping layer;
    a deep isolation ring surrounding the light-sensing region, wherein the doping layer extends from the doping region to a position which is in the deep isolation ring;
    a plurality of color filters formed on the doping region and the deep isolation ring, wherein the doping layer protrudes into the light-sensing region along a direction farther away from the color filters; and
    a plurality of microlens structures formed on the color filters.

18. The image sensor device structure as claimed in claim 17, wherein the deep isolation ring comprises:
    a high-k dielectric layer formed in the deep isolation ring and below the doping layer; and
    a oxide layer formed on the high-k dielectric layer.

19. The image sensor device structure as claimed in claim 17, wherein the light-sensing region comprises a first portion with a first doping concentration and a second portion with a second doping concentration, the second portion is closer to the transistor device than the first portion, the second doping concentration is higher than the first doping concentration, and the doping region is in direct contact with the first portion.

20. The image sensor device structure as claimed in claim 17, further comprising:
a transistor device formed over the first surface of the substrate, wherein the transistor device is between the interconnect structure and the doping region.

\* \* \* \* \*